(12) United States Patent
Pender

(10) Patent No.: US 6,958,868 B1
(45) Date of Patent: Oct. 25, 2005

(54) MOTION-FREE TRACKING SOLAR CONCENTRATOR

(76) Inventor: John George Pender, 1668 Skyflight Ave., Fairbanks, AK (US) 99709

( * ) Notice: Subject to any disclaimer, the term of this patent is extended or adjusted under 35 U.S.C. 154(b) by 60 days.

(21) Appl. No.: 10/813,749

(22) Filed: Mar. 29, 2004

(51) Int. Cl.[7] ............... G02B 3/08; G02B 5/30; G02B 27/28; F24J 2/00; H01L 25/00
(52) U.S. Cl. ............. 359/742; 359/495; 126/569; 136/246
(58) Field of Search ............. 359/625–627, 359/726, 727, 742, 743, 495, 265, 266; 126/569, 126/571–573, 598–700, 684; 136/246

(56) References Cited

U.S. PATENT DOCUMENTS 4,456,783 A * 6/1984 Baker .................. 126/573
6,700,054 B2 * 3/2004 Cherney et al. ............ 359/726
2004/0179148 A1 * 9/2004 Nishioka et al. ........... 349/56

* cited by examiner

Primary Examiner—Georgia Epps
Assistant Examiner—Alicia M. Harrington

(57) ABSTRACT

An integrated solar concentrator and tracker is constructed from a beam deflector for unpolarized light in combination with a fixed optical condenser. The one-dimensional beam deflector consists of a pair of prism arrays made from a material whose refractive index can be varied by applying an electric field. Two of the one-dimensional concentrators can be arranged with their faces in contact and with their prism arrays perpendicular to construct a two-dimensional beam deflector. The intensity and distribution of an applied field modifies the refractive index of the individual prisms in order to keep direction of the deflected beam fixed as the incident beam shifts. When the beam deflector is used with the fixed concentrator the result is that the position of the focus remains fixed as the source moves.

18 Claims, 30 Drawing Sheets

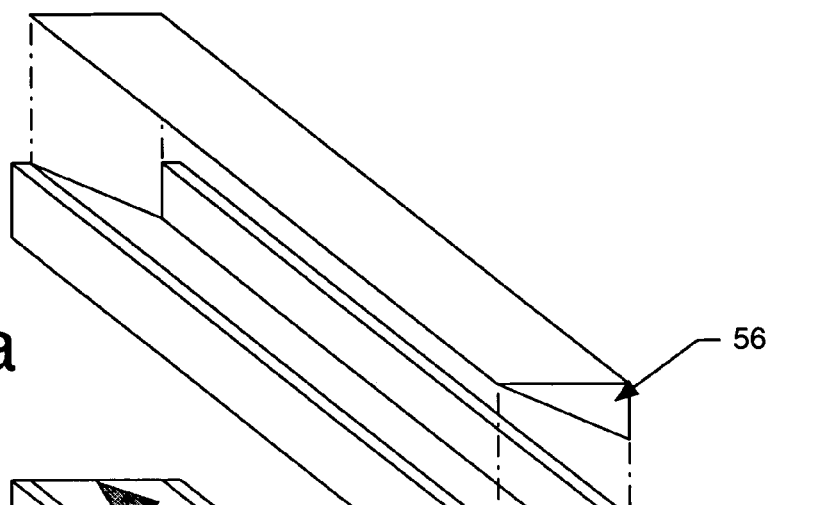
Figure 5a
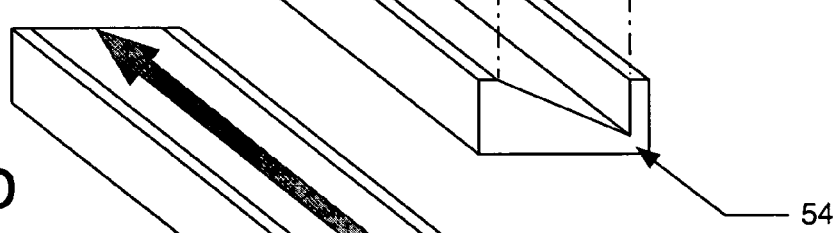
Figure 5b
Figure 5c
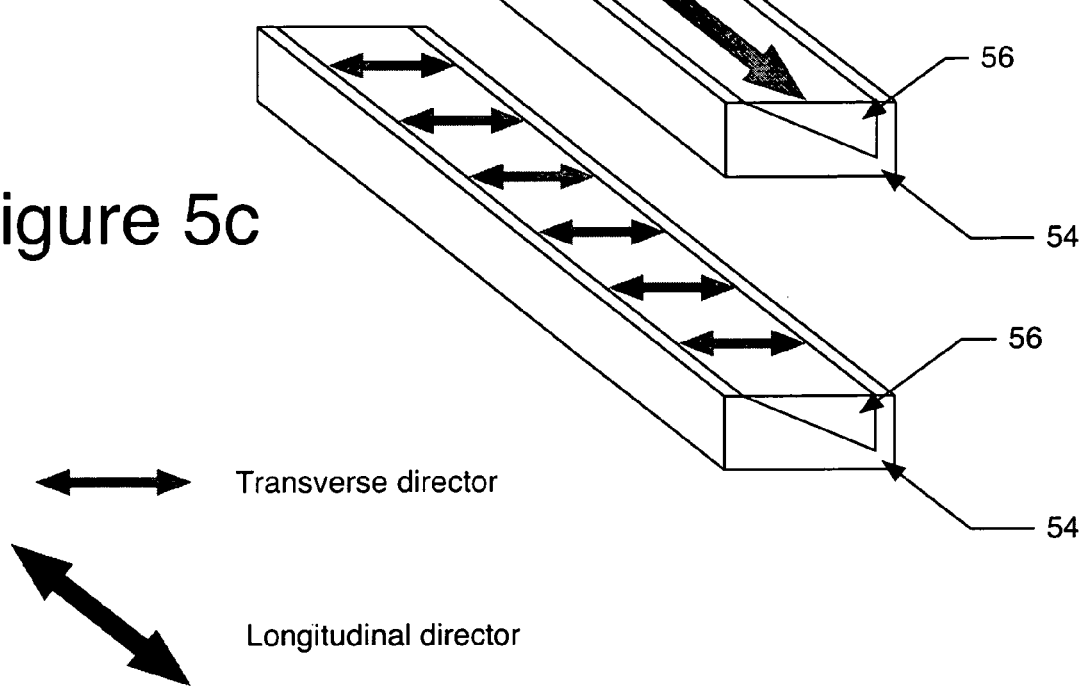
↔ Transverse director
↕ Longitudinal director

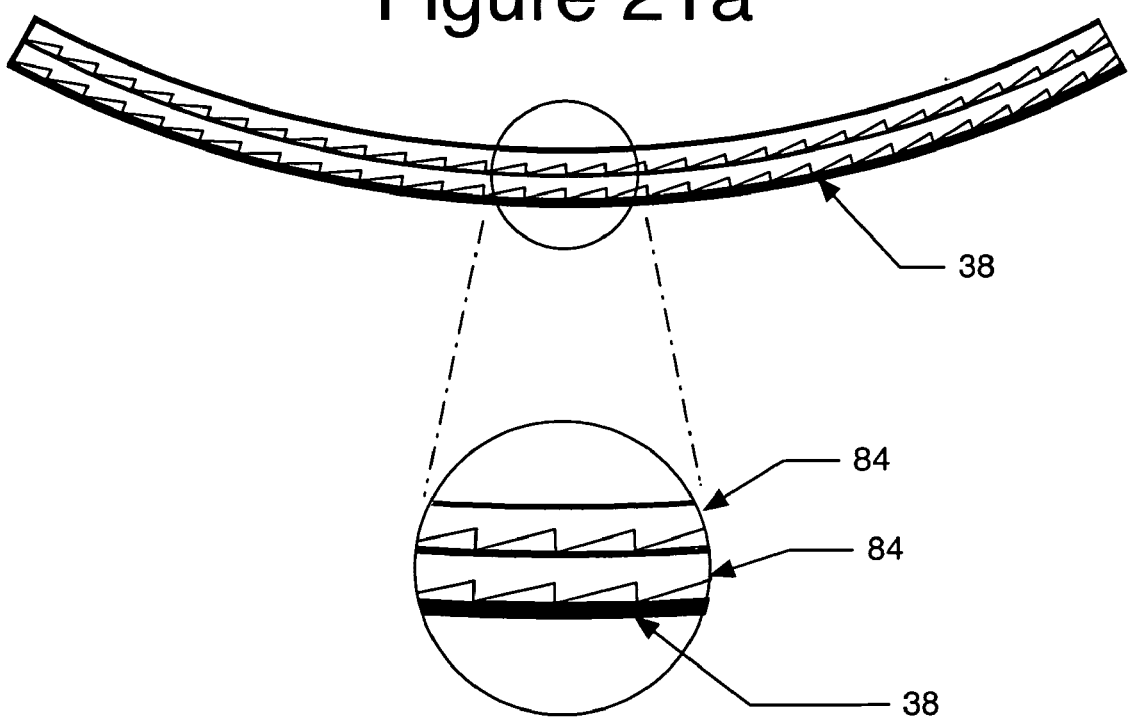

MOTION-FREE TRACKING SOLAR CONCENTRATOR

CROSS REFERENCE TO RELATED APPLICATIONS

Not Applicable

STATEMENT REGARDING FEDERALLY SPONSORED RESEARCH OR DEVELOPMENT

Not Applicable

DESCRIPTION OF ATTACHED APPENDIX

Not Applicable

FIELD OF THE INVENTION

This invention relates generally to the field of solar power and more specifically to a machine for concentrating solar radiation.

DESCRIPTION OF THE PRIOR ART

A number of systems for passive, or non-tracking, concentration of solar energy in one dimension to a line-like focus have been produced in the past. Among such systems are those shown in U.S. Pat. Nos. 6,467,916, 5,537,991, 5,289,356, 4,487,961, 4,359,265, 4,230,095, 4,003,638, and 4,002,499. A common characteristic of these systems is the use of smooth reflective surfaces to reflect light from the sun onto a region to be heated, such as a fluid-filled conduit.

The overall efficiency of the heating process is improved if the system incorporates a tracking mechanism to compensate for the apparent daily and seasonal motion of the sun. This can be accomplished by keeping the solar collector fixed and moving the target to the optical focus as the focus shifts with the motion of the sun (such as U.S. Pat. No. 4,000,734). More commonly the collector is continuously repositioned in order to keep the location of the focus fixed as the sun moves. This can be accomplished by adjusting the tilt of a mirror or an array of mirrors (such as U.S. Pat. Nos. 4,148,564 and 4,355,630), or adjusting the tilt of a prism or an array of prisms (such as U.S. Pat. Nos. 4,377,154 and 4,382,434).

Applications such as daylighting require high concentration ratios (point, or spot focus) and the ability to track the sun along two axes. A wide range of collectors is used to accomplish this, from Fresnel lenses and arrays of Fresnel lenses, to parabolic reflectors and arrays of parabolic reflectors, to holographic optical elements, and to combinations of these elements such as those shown in U.S. Pat. Nos. 6,384,320, 6,299,317, 6,274,860, 5,325,844, 4,832,002, 4,409,963, 4,297,000, and 4,153,474. In all cases it is necessary to incorporate a mechanical tracking mechanism to keep the solar energy focused onto the target to compensate for the sun's apparent daily and seasonal motion.

Existing solar collectors that actively track the sun's apparent motion incorporate a mechanical tracking system that both supports and tilts the collector in order to keep the solar energy aligned with the target. The drive must be robust enough to move the solar concentrator yet not be moved by external influences like the wind, which has the effect of degrading the alignment. Potential failure of the motion drive presents reliability and maintenance issues. As the collector is made larger for higher power systems its increased mass requires more robust support and tracking infrastructure, which leads to even higher total mass. At some point it makes sense to replace a single large collector with an array of smaller collectors, each of which has its own tracking mechanism, but the large number of mechanical drives compromises maintenance and reliability.

U.S. Pat. No. 6,169,594 describes a device which steers a collimated, polarized beam of light in one or two dimensions. A control voltage varies the refractive index of one or more arrays of prism-shaped cells of liquid crystal, which varies the deflection angle of the incident beam of light. This beam steering technology has not to date been generalized to steer unpolarized light nor has it been used in conjunction with a focusing element to concentrate light. The objective has been to create a small, fast, device that steers an unexpanded, polarized laser beam with a minimum of wavefront distortion. However, the problem of concentrating solar radiation does not require high speed nor does it require a high-quality image at the target. It does, however, require good efficiency, the ability to handle unpolarized light, large collection area, and a focusing element, none of which are features of the current technology.

BRIEF SUMMARY OF THE INVENTION

The invention is a solar collector consisting of a Fresnel lens or other optical condenser, and one or more arrays of prismatic cells made from a material whose refractive index may be varied by applying an electromagnetic field. The refractive index of the cells is varied by the applied field in such a manner as to direct sunlight at a fixed angle into the condenser which then concentrates the light to a focus. The field is adjusted as the sun moves in the sky in order to keep the position of the optical focus fixed. There are no moving parts. Since the concentrator does not need to move, the design and construction of a support structure which resists vibration from wind is easier. Elimination of a mechanical tracking mechanism improves reliability and reduces overall weight. Other objects and advantages of the present invention will become apparent from the following descriptions, taken in connection with the accompanying drawings, wherein, by way of illustration and example, an embodiment of the present invention is disclosed.

BRIEF DESCRIPTION OF THE DRAWINGS

FIG. 5a is an exploded isometric view showing a groove in a block of transparent material and the material filling the groove.

FIG. 5b is an isometric view of a longitudinal director applied to a prism-shaped volume of liquid crystal.

FIG. 5c is an isometric view of a transverse director applied to a prism-shaped volume of liquid crystal.

FIG. 21a is a cross-sectional view of a fifth implementation of the 1D tracking solar concentrator.

FIG. 21b is an enlarged cross-sectional view of a portion of a fifth implementation of the 1D tracking solar concentrator.

DETAILED DESCRIPTION OF THE PREFERRED EMBODIMENTS

Introduction

The collection and concentration of solar energy is a fundamental component in many heating, power generation, and daylighting applications. A first application is solar water heating. This is often accomplished by circulating water in a length of conduit, both ends of which connect to a holding tank. Solar radiation is concentrated on a section of the conduit, which gradually warms the water in the tank as the water in the conduit circulates.

A second application is the production of electric power using photovoltaic cells. Many applications involve a large-area device which collects the radiation and concentrates it onto a small photovoltaic cell which is specially designed to handle high power density. The point is to lower overall cost by reducing the area of expensive photovoltaic cells by incorporating relatively low-cost solar concentrators.

A third application is fiberoptic daylighting. This refers to the process of collecting visible radiation from the sun and directing it into one end of an optical fiber. The other end of the fiber terminates at a diffuser inside a building where the solar radiation provides passive lighting.

A fourth application is mechanical power generation by concentrating solar energy onto the heat cup of a Stirling engine. The heat is converted into rotational mechanical energy which may by used directly or converted to electricity using a generator.

Figure 1:
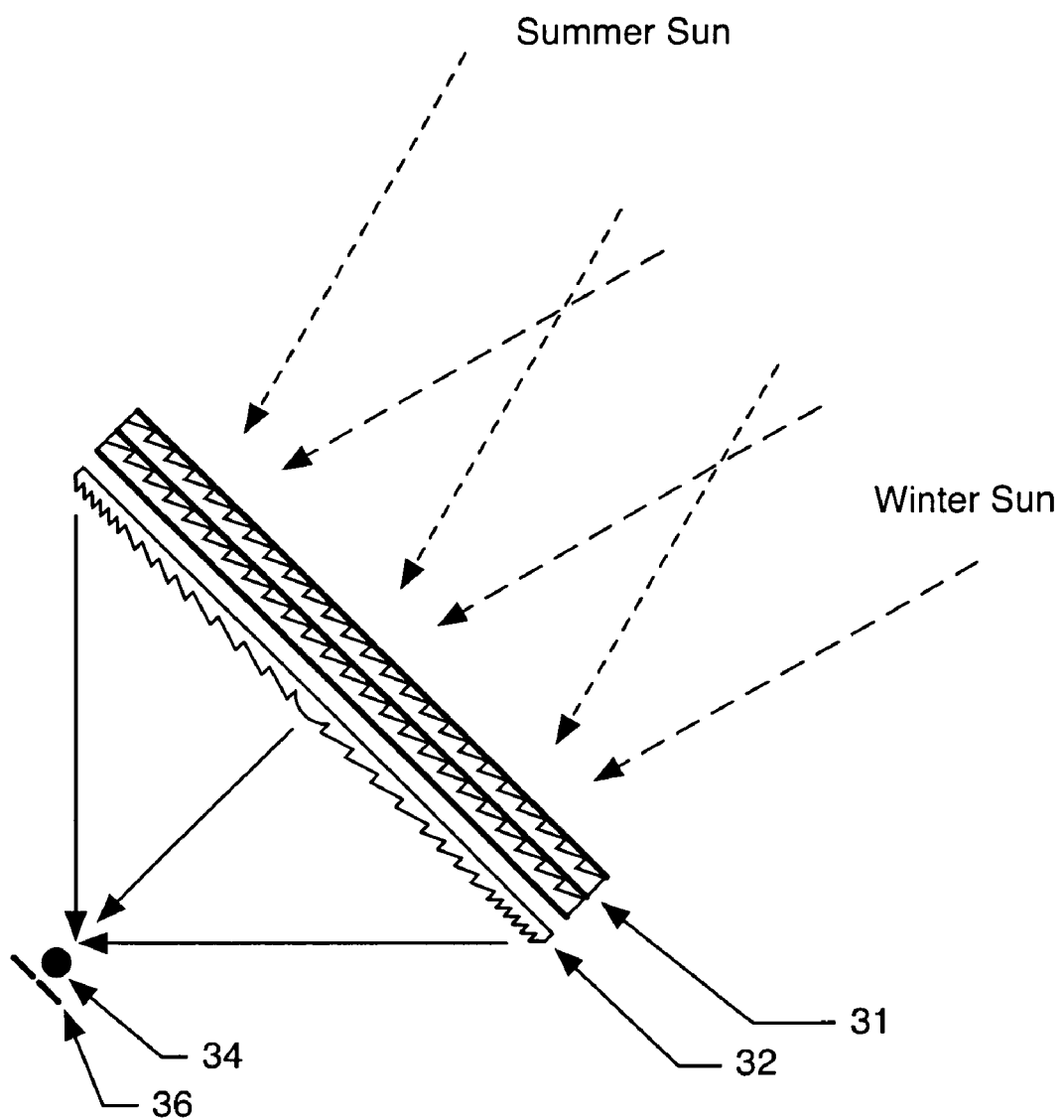
FIG. 1 is a cross-sectional view of the one-dimensional solar collector using a Fresnel lens as the optical condenser.
Figure 2:
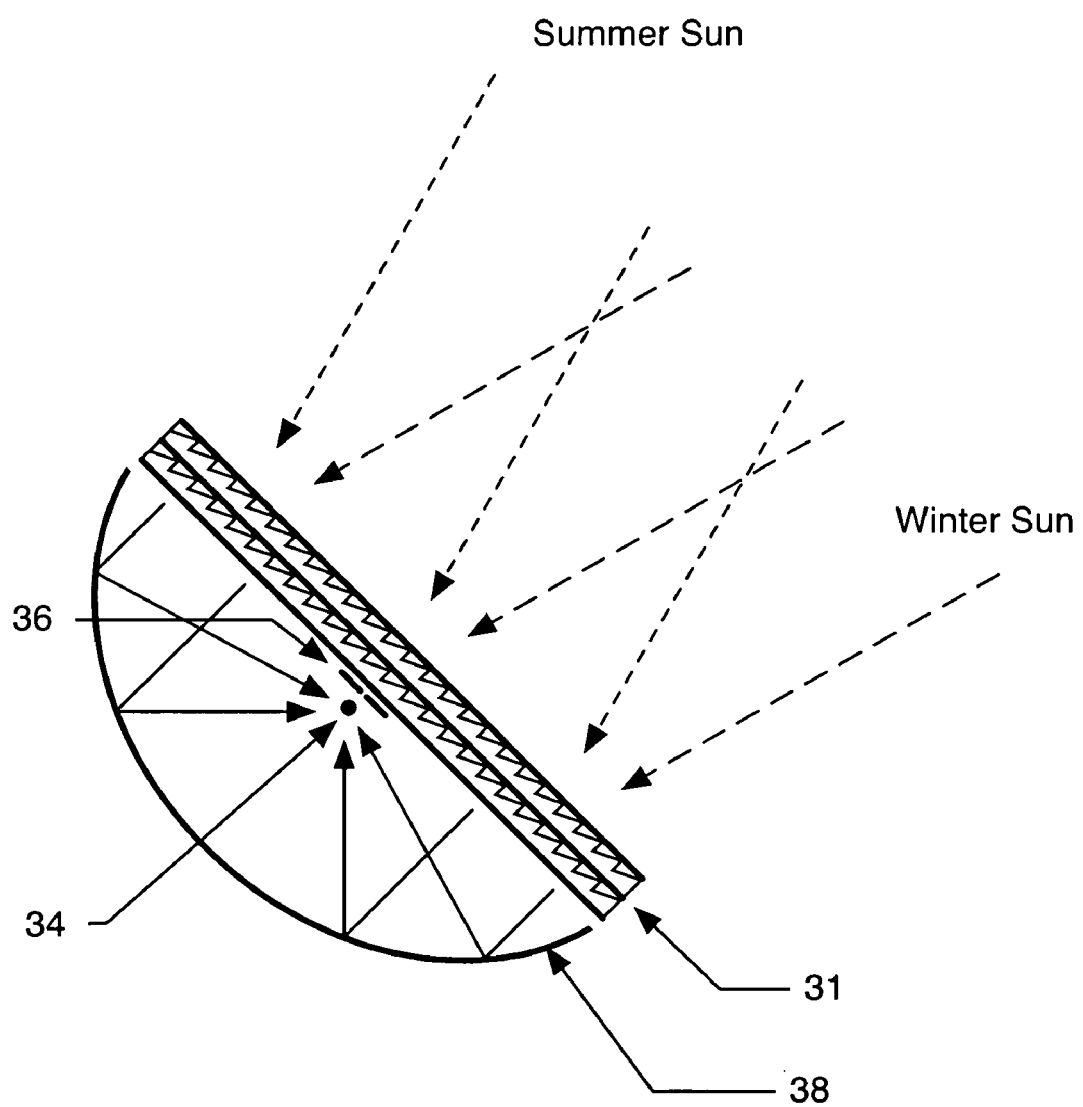
FIG. 2 is a cross-sectional view of the one-dimensional solar collector using a parabolic trough mirror as the optical condenser.

All of these applications may be realized using the device described in this document. FIG. 1 illustrates in cross section the preferred implementation of a device which concentrates light to a line-like focus for solar water heating. There is the beam deflector assembly 31 and there is the optical condenser 32, shown as a Fresnel lens. An electromagnetic field is applied to the beam deflector assembly which changes the refractive index of prism-shaped cells of liquid crystal, steering incoming light so that it always strikes the Fresnel lens at a fixed angle. The condenser then concentrates the light onto a stationary target such as a length of fluid-filled pipe 34. The combined effect of these elements is to keep light concentrated onto the pipe as the Sun moves. Detectors 36 placed near the target provide feedback which is used to maintain the quality of the alignment. FIG. 2 shows an alternate implementation in which a parabolic trough reflector 38 is used instead of a Fresnel lens.

Analysis of a Triangular Prism

Figure 3:
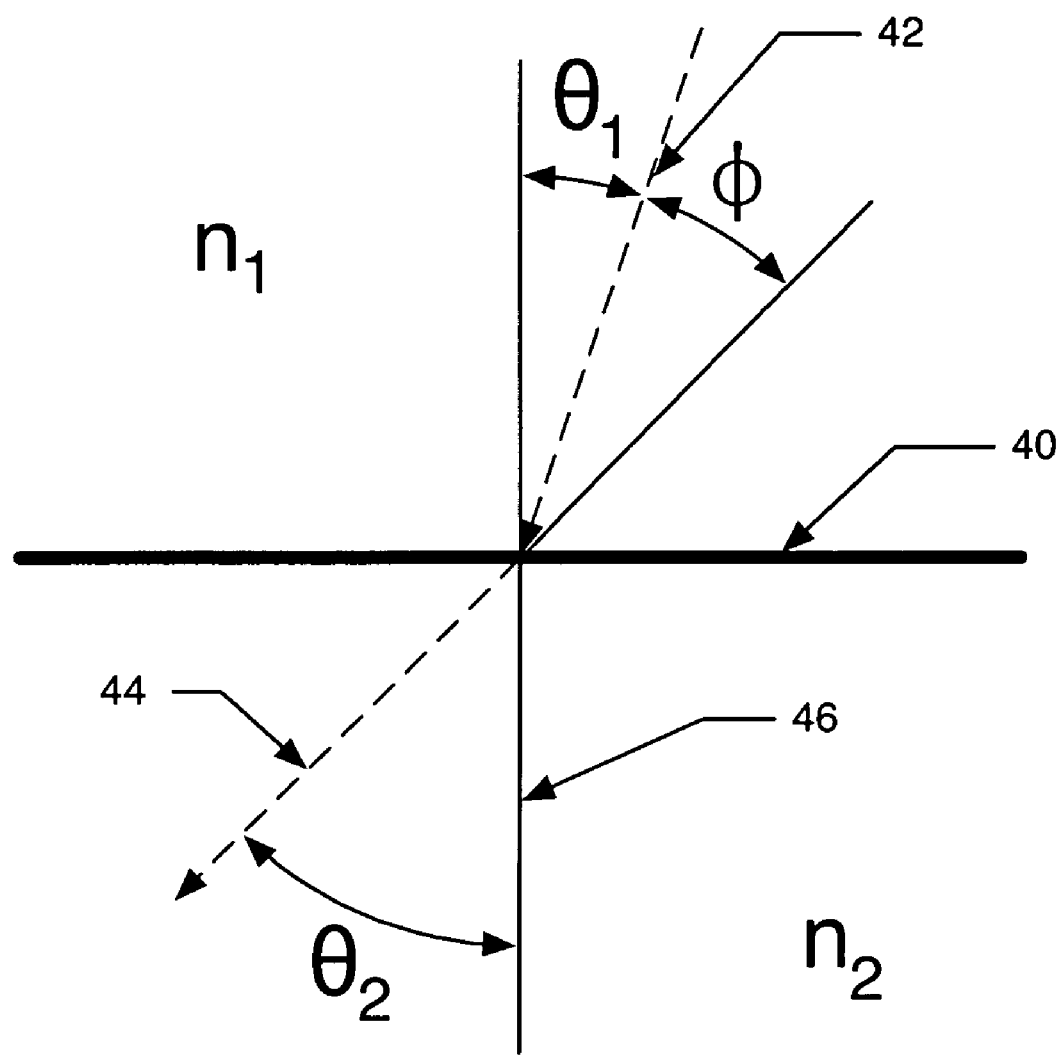
FIG. 3 is a diagram illustrating Snell's Law.

FIG. 3 is a diagram showing the refraction that takes place when light strikes an interface 40 separating two different media, each of which has a distinct refractive index. The relationship between the direction of the incident ray 42 and that of the refracted ray 44 is quantified in an equation called Snell's Law, which may be written $$n_1 \sin(\theta_1) = n_2 \sin(\theta_2)$$

where $n_1$ and $n_2$ are the refractive indices of medium one and medium two, respectively. FIG. 3 illustrates the case for which $n_1 > n_2$, though the reverse may also be assumed. The angle $\theta$ is defined with respect to a line 46 drawn perpendicular to the interface 40 and through the point at which the incident ray strikes the interface. Note that a ray striking a surface at normal (perpendicular) incidence ($\theta_1 = 0$) is not deflected.

Figure 4A:
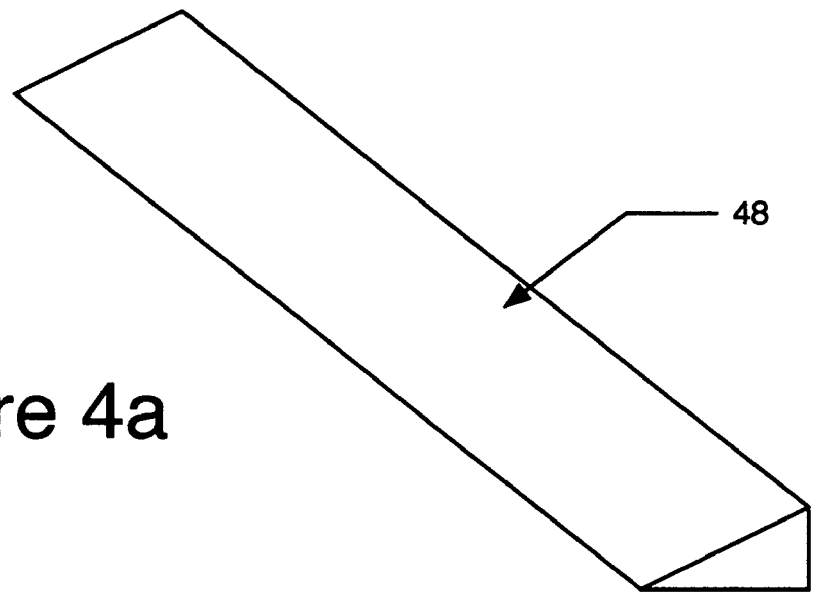
FIG. 4a is an isometric view of a triangular prism.
Figure 4B:
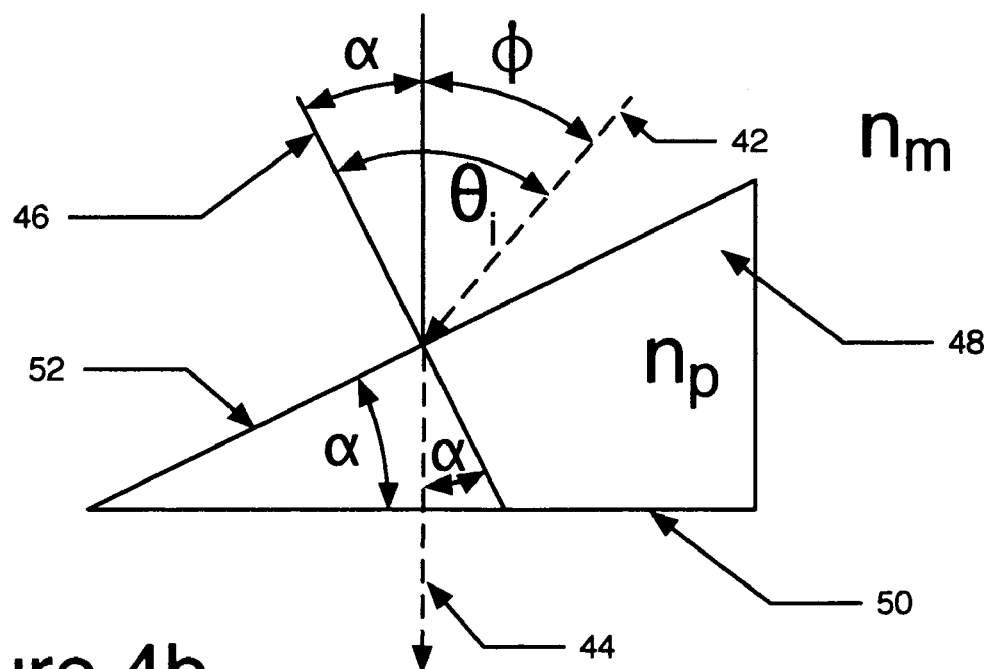
FIG. 4b is a cross-sectional view of a triangular prism illustrating the deflection of a beam of light.

Consider a triangular prism 48 embedded in a uniform medium as shown in perspective in FIG. 4a and in cross section in FIG. 4b. Rays of light incident on this prism always emerge from the prism with their propagation direction changed if the refractive index of the prism, $n_p$, is different from the refractive index of the surrounding medium, $n_m$. The relevant task at this point is to choose the propagation direction of the incident ray 42 in order to ensure that the ray 44 emerging from the prism does so perpendicular to the exit face 50 of the prism. Applying Snell's Law to the incident face 52 leads to $$n_m \sin(\theta_i) = n_p \sin(\alpha)$$

where the angle between the incident face 52 and the exit face 50 of the prism is $\alpha$. The angle between the incident ray and the exit ray, referred to as the deflection angle, $\phi$, is thus $$\phi = \theta_i - \alpha = \sin^{-1}((n_p/n_m) \sin(\alpha)) - \alpha.$$

Assume that the refractive index of the prism, $n_p$, may be varied continuously over a range without changing the physical dimensions or orientation of the prism. That is, $$n_{p,min} < n_p < n_{p,max}.$$

There is then a continuous range of incident angles at which an incident ray 42 may strike the prism and be made to emerge from the prism normal to the exit face 50 by adjusting the refractive index of the prism. The deflection angle associated with the maximum index, $n_{p,max}$, is $$\phi_{max} = \sin^{-1}((n_{p,max}/n_m) \sin(\alpha)) - \alpha$$

and the deflection angle associated with the minimum index, $n_{p,min}$, is $$\phi_{min} = \sin^{-1}((n_{p,min}/n_m) \sin(\alpha)) - \alpha.$$

The total range of deflection angles is $\Delta\phi = \phi_{max} - \phi_{min}$.

FIG. 5a shows how such a prism may be constructed by filling a prism-shaped groove in a block of transparent material 54 with a material 56 whose refractive index may be changed by applying an electromagnetic field. Ideally, a material which interacts in the same way with all incident light polarizations is used to fill the groove. The prism-shaped groove may also be filled with a liquid crystal material. Liquid crystals comprise a class of materials composed of elongated, polar molecules which tend to align with their long axes parallel to one another. Typically, the surface of a volume of liquid crystal is brushed to align the long axes of the surface molecules in a specific direction. This has the effect of aligning the long axes of all the other molecules in the same direction, which is called the director. For the prism-shaped volume of liquid crystal it is most convenient to set the director in the plane of the exposed surface, either parallel to the long dimension of the prism (longitudinal director) as is FIG. 5b, or perpendicular to the long dimension (transverse director) as in FIG. 5c.

Figure 6:
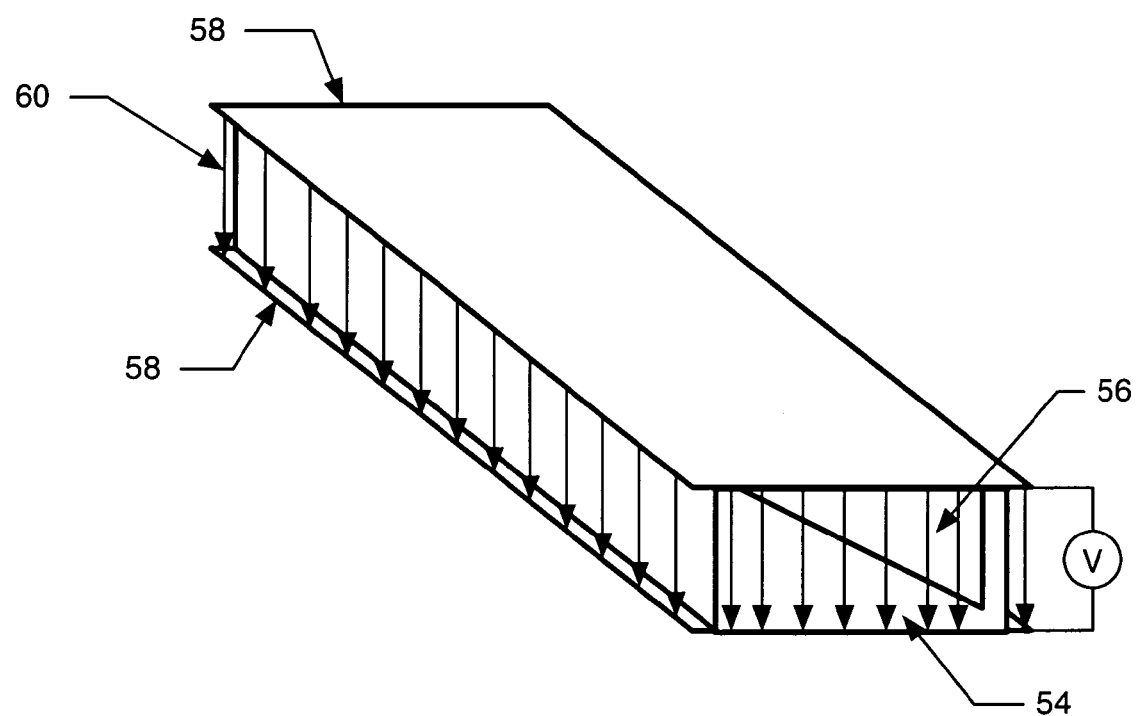
FIG. 6 is an isometric view showing a first electrode configuration which produces an electric field through a prism-shaped volume of liquid crystal.

Light polarized parallel to the director experiences a different refractive index than light polarized perpendicular to the director. This effect is referred to as birefringence and can be used to make a prism with a variable refractive index for light polarized parallel to the director. This is accomplished by applying an electric field normal to the exit face of the prism as shown in FIG. 6; i.e. parallel to the propagation direction of the light and perpendicular to either director. A coating of conductor 58 thin enough to be nearly transparent is applied to the top and the bottom surfaces of the prism/block device, and a voltage is applied between the conducting surfaces. This creates an electric field 60 in the desired direction whose strength depends on the magnitude of the applied voltage.

Figure 7A:
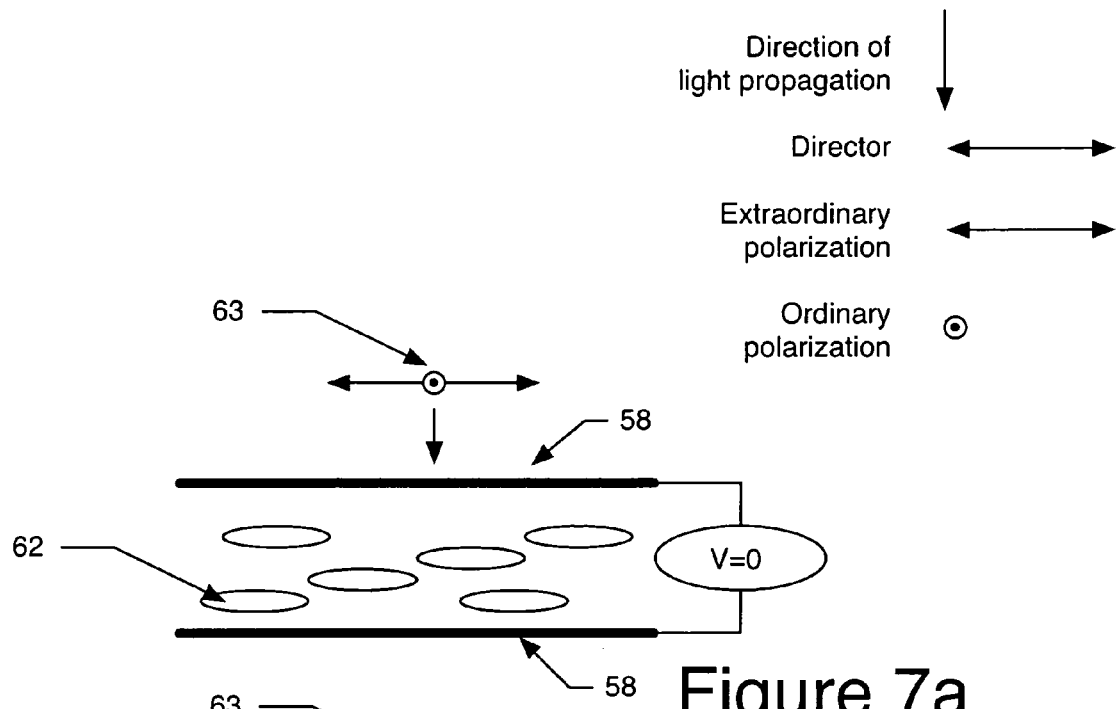
FIG. 7a is a cross-sectional view of a volume of liquid crystal showing the orientation of liquid crystal molecules in the absence of an electric field.
Figure 7B:
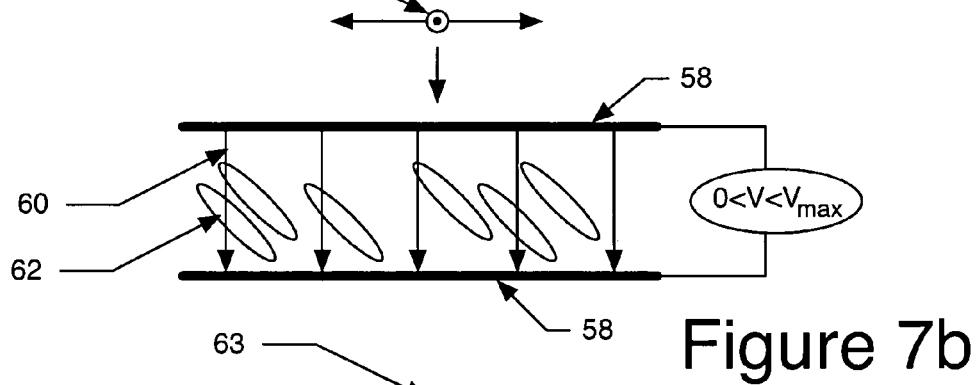
FIG. 7b is a cross-sectional view of a volume of liquid crystal showing the orientation of liquid crystal molecules in the presence of a moderate electric field.
Figure 7C:
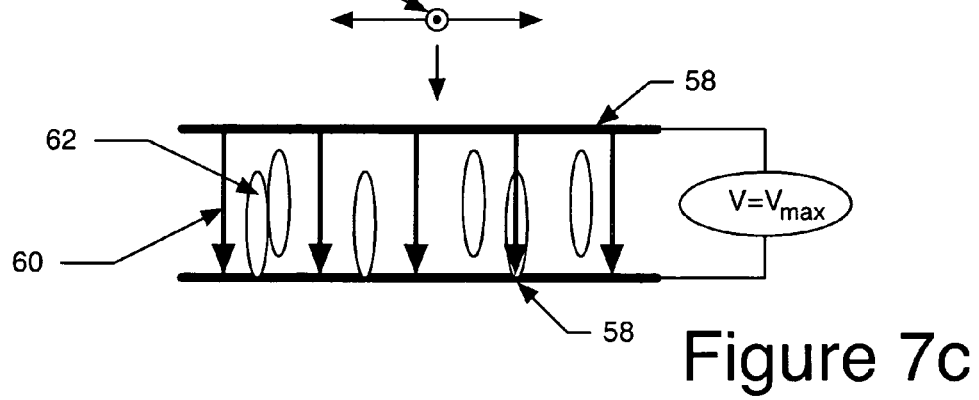
FIG. 7c is a cross-sectional view of a volume of liquid crystal showing the orientation of liquid crystal molecules in the presence of a high electric field.

FIG. 7a shows the orientation of liquid crystal molecules 62 in a volume of liquid crystal material in the absence of an applied electric field. The director is well defined. In FIG. 7b a voltage is applied to transparent conducting layers 58 on the top and bottom surfaces. The resulting electric field 60 causes the molecules to rotate away from the director and toward the direction of the applied field. The stronger the field, the greater the alignment with the field. Eventually, as shown in FIG. 7c, almost all the molecules are aligned with the field (the surface molecules being the exception) and not the director. At this point increasing the field no longer changes the optical properties of the liquid crystal. When the field is turned off the molecules return to their original orientation.

Unpolarized light 63 incident on the volume of liquid crystal may be resolved into a component polarized parallel to the director, referred to as the extraordinary ray, and a component polarized perpendicular to the director, referred to as the ordinary ray. The polarization of the ordinary ray remains perpendicular to the long axis of the molecules for all values of the applied voltage so it experiences no change in refractive index, which is referred to as the ordinary refractive index, $n_o$. The polarization of the extraordinary ray is parallel to the long axis of the molecules when there is no field (FIG. 7a) and the refractive index it experiences in this case, $n_e$, is typically larger than $n_o$. As the applied electric field increases (FIG. 7b) the long axis of the molecules rotates away from the polarization direction of the extraordinary ray, which changes the refractive index the light experiences. When all the molecules are aligned with the applied field the extraordinary ray experiences the same refractive index as the ordinary ray, $n_o$, as shown if FIG. 7c. Therefore the refractive index of the extraordinary ray can be controlled by an applied voltage and lies in the range $$n_o, n_e(V) < n_e.$$

Figure 8A:
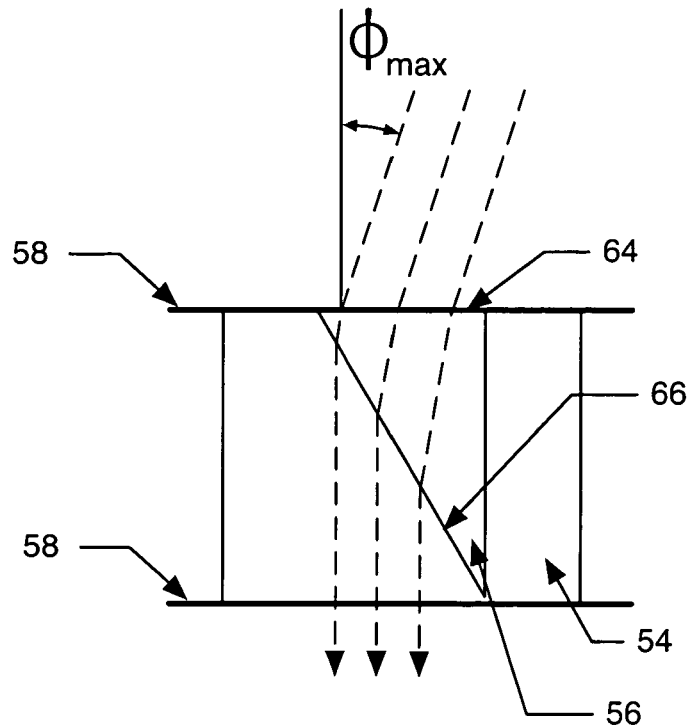
FIG. 8a is a cross-sectional view showing the maximum deflection of an extraordinary ray incident on an asymmetric liquid crystal prism.
Figure 8B:
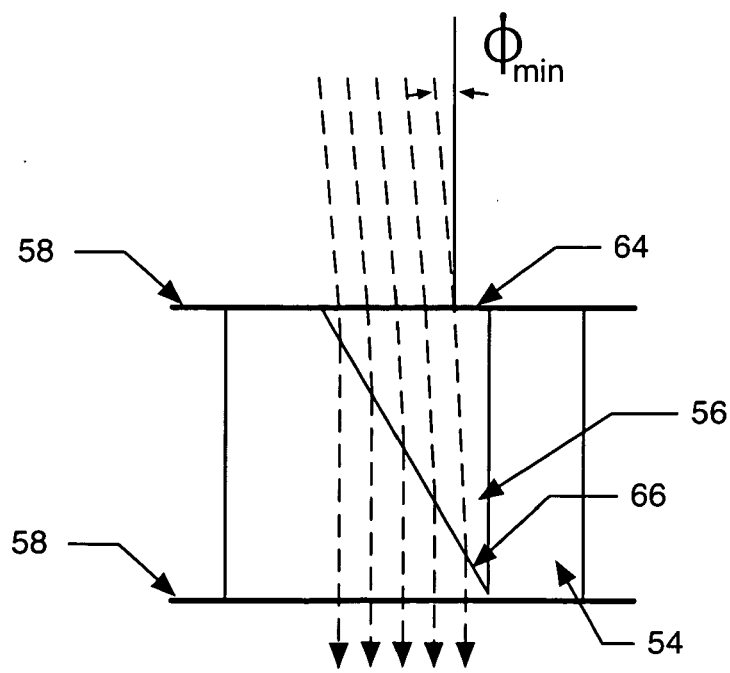
FIG. 8b is a cross-sectional view showing the minimum deflection of an extraordinary ray incident on an asymmetric liquid crystal prism.

By way of example, consider the device illustrated in cross section in FIG. 8. Assume that the transparent embedding block 54 is made of polycarbonate, $n_{poly}=1.58$, and the prism-shaped volume of liquid crystal 56 has $\alpha=45°$. BDH-E44 is a typical liquid crystal, having ordinary refractive index $n_o=1.53$ and zero-field extraordinary refractive index $n_e=1.79$. This and other liquid crystals are commercially available from E. M. Industries of Hawthorne, N.Y., as well as other suppliers. Snell's Law is used to calculate the deflection of an incident beam of light, though it is now necessary to account for two interfaces: the boundary 64 between air and the liquid crystal, and the boundary 66 between the liquid crystal and the polycarbonate. As before, it is assumed that the ray strikes the exit face of the device (the bottom surface of the polycarbonate block) normal to its surface. The deflection angle for the ordinary ray is a constant, calculated for refractive index $n_o$, and has value $\phi_{min}=-2.9°$. This angle is also one extreme of the range of possible incident angles for the extraordinary ray. The other extreme is calculated for refractive index $n_e$ and has value $\phi_{max}=11.5°$. The deflection range of the extraordinary ray, $\Delta\phi= 13.1°+2.8°=14.4°$, can be increased in at least two ways. First, a different liquid crystal with a larger birefringence, $n_e-n_o$, may be used. Second, the angle $\alpha$, may be increased. For instance, if $\alpha=60°$ instead of 45° then the deflection angles become $\phi_{min}=-5.2°$ and $\phi_{max}=18.4°$, for a deflection range of $\Delta\phi=23.6°$.

Figure 9A:
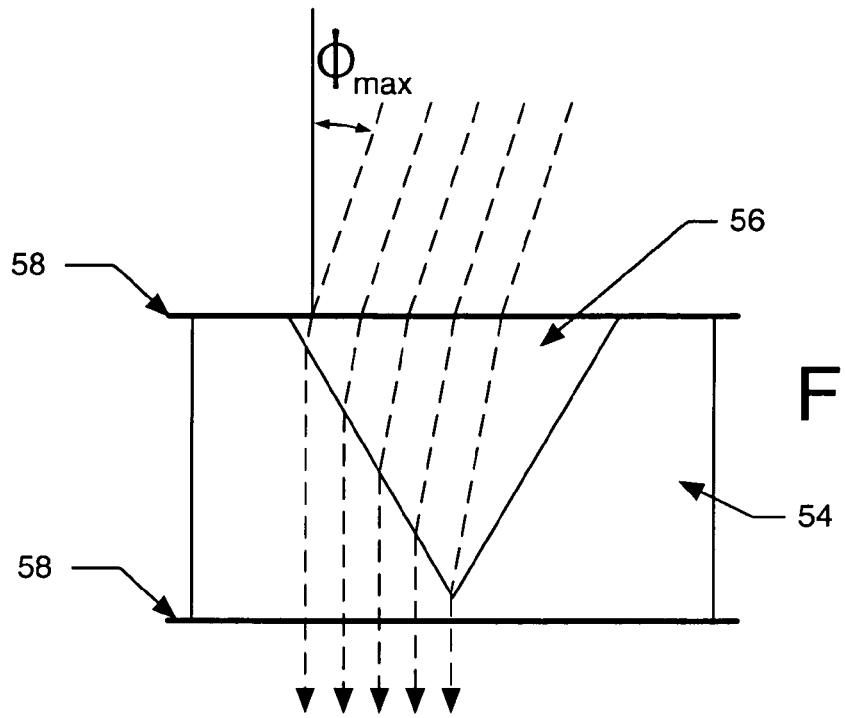
FIG. 9a is a cross sectional view showing the maximum deflection of an extraordinary ray incident on a symmetric liquid crystal prism.
Figure 9B:
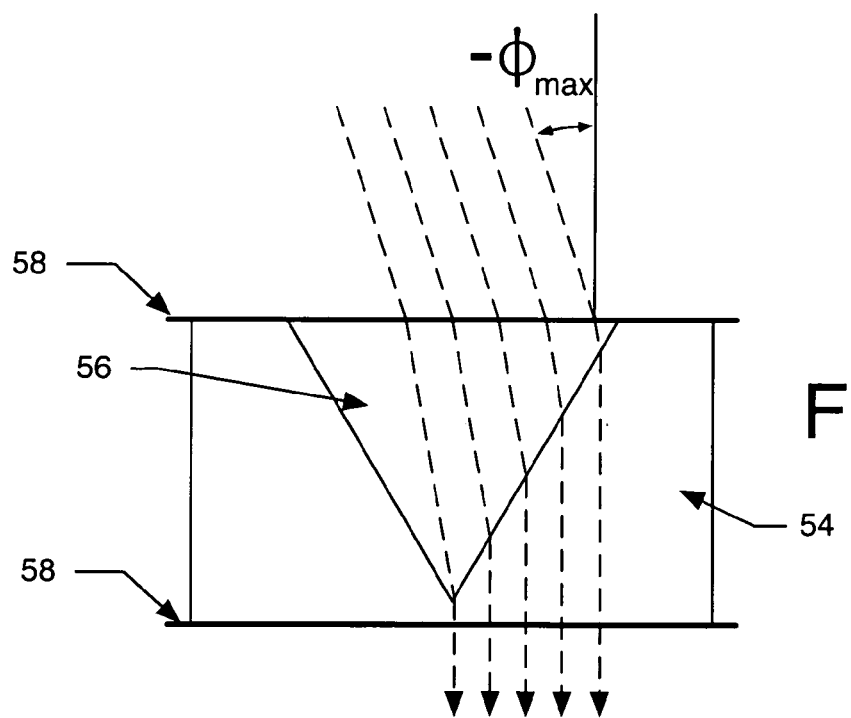
FIG. 9b is a cross sectional view showing the minimum deflection of an extraordinary ray incident on a symmetric liquid crystal prism.

A case may be made for changing the cross section of the prism as shown in FIG. 9. The symmetry of the groove allows the deflection range to extend from $-\phi_{max}$ to $\phi_{max}$ for a total deflection range of $\Delta\phi=2\phi_{max}$. Using the numbers from the previous example, this becomes $\Delta\phi=23.0°$ for $\alpha=60°$ and $\Delta\phi=36.8°$ for $\alpha=60°$. The down side is that only half the polycarbonate-liquid crystal surfaces are participating in the process at any given time.

Figure 10:
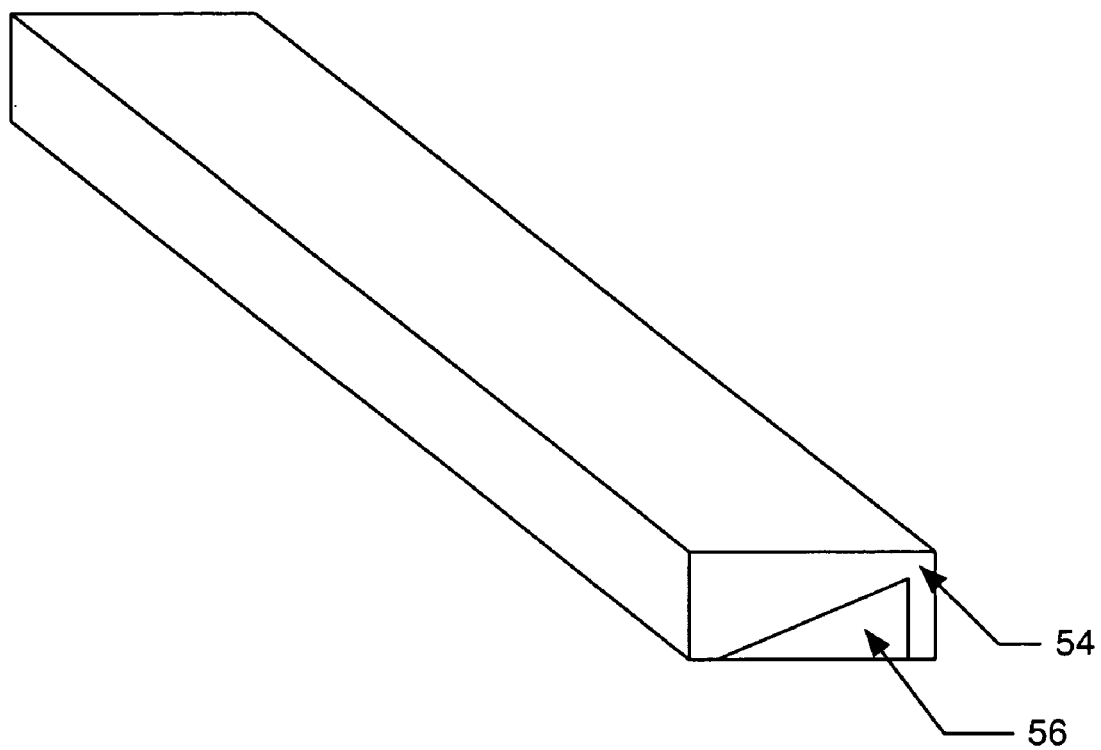
FIG. 10 is an isometric view of a second geometric configuration of a liquid crystal prism embedded in a transparent block.

It is worthwhile examining the embedded prism with a slightly different geometry, as shown in FIG. 10, in which the exit face of the prism, not the entrance face of the prism, is parallel to the faces of the embedding block. The exit ray is assumed to emerge normal to the exit face of the prism, the materials in the previous example are reused, and Snell's Law is used to calculate the trajectory of incident rays. When a $\alpha=45°$ the deflection angles become $\phi_{min}=-2.8°$ and $\phi_{max}=13.1°$, for a total deflection range of $\Delta\phi=15.9°$. When $\alpha=60°$ the deflection angles become $\phi_{min}=-4.7°$ and $\phi_{max}=30.7°$, for a total deflection range of $\Delta\phi=35.4°$. The deflection range is considerably larger than that of the previous example, despite the fact that the prism has exactly the same dimensions, because the orientation of the media with respect to the incident light have an effect on the refraction of light. The deflection range can also be affected, for instance, by relaxing the condition that the exit ray must be normal to the bottom surface.

From these simple examples it is clear there are many design parameters which influence device performance: choice of materials, especially the liquid crystal, and the orientation and apex angle of the prism. In general, the design of a device which maximizes total energy in a day (solar heating) will be different than a design which maximizes deflection range (passive solar lighting).

Curved Grating Faces

Figure 11:
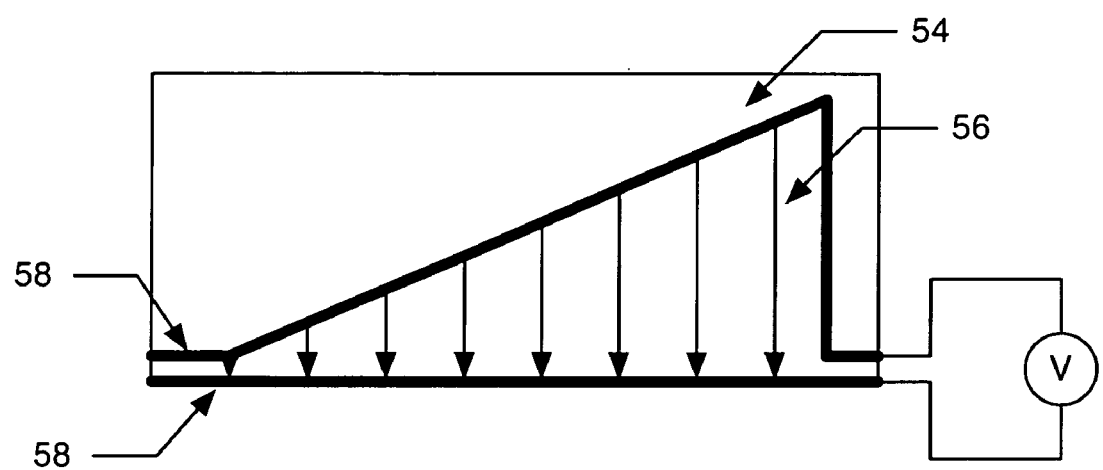
FIG. 11 is a cross-sectional view of a second electrode configuration which produces an electric field through a liquid crystal prism.
Figure 12:
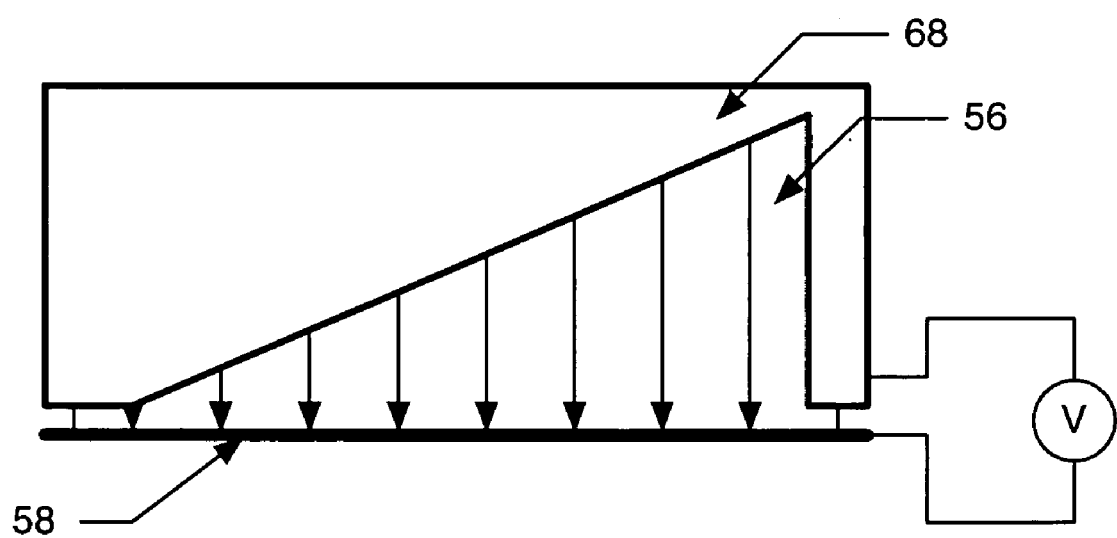
FIG. 12 is a cross-sectional view of a third electrode configuration which produces an electric field through a liquid crystal prism.

There are at least three ways to generate the applied electric field through the liquid crystal prism. The first method has been shown in FIG. 6, wherein an essentially transparent coating 58 which is conductive enough to form an equipotential surface has been applied to the top and bottom surfaces of the prism/block device. The second method is to apply the coating 58 to the interface between the liquid crystal and the fixed index material as well as the face containing the exposed liquid crystal surface, as shown in FIG. 11. The third method is to use a transparent conducting material 68 for the fixed index block as shown in FIG. 12. The latter two methods have the advantage of not having to create a field in the fixed refractive index material in order to get a field in the liquid crystal, which reduces the total required voltage. The latter two methods also have a disadvantage in that the two conducting surfaces are now very close together. Should the two surfaces come into electrical contact the electric field would disappear entirely.

The optical analysis performed above on the prisms presumes a uniform electric field applied to the liquid crystal prisms. There is only one way to do this: the electrode configuration of FIG. 6 and the requirement that the liquid crystal and the fixed index medium have the same electric permittivity. If this is not the case, or if either the second or third electrode configuration is used, then the electric field will vary from one part of the liquid crystal prism to another. This leads to a spatial nonuniformity in the extraordinary refractive index, the general effect of which will be that the light emerging from the prism will not be collimated; i.e. "lensing" will take place.

Figure 13A:
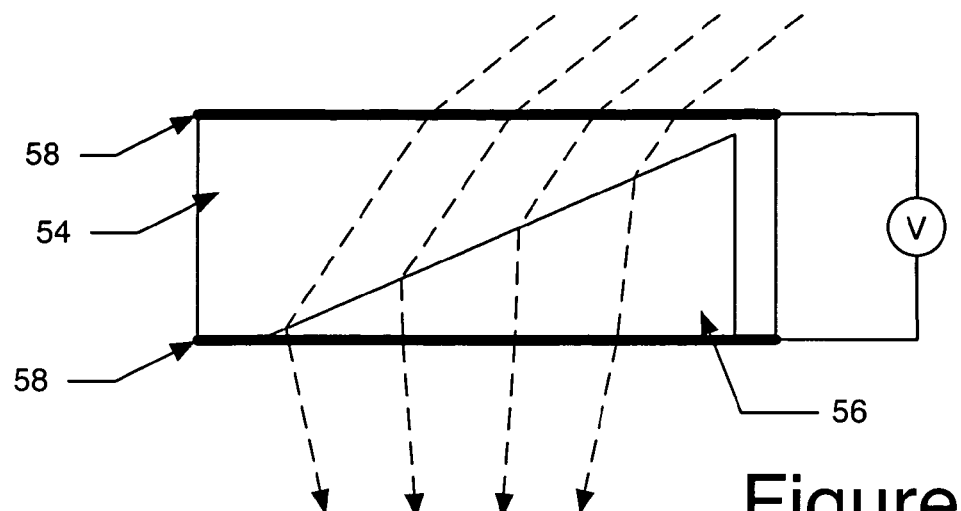
FIG. 13a is a cross-sectional view of positive lensing in a liquid crystal prism due to nonuniform field.
Figure 13B:
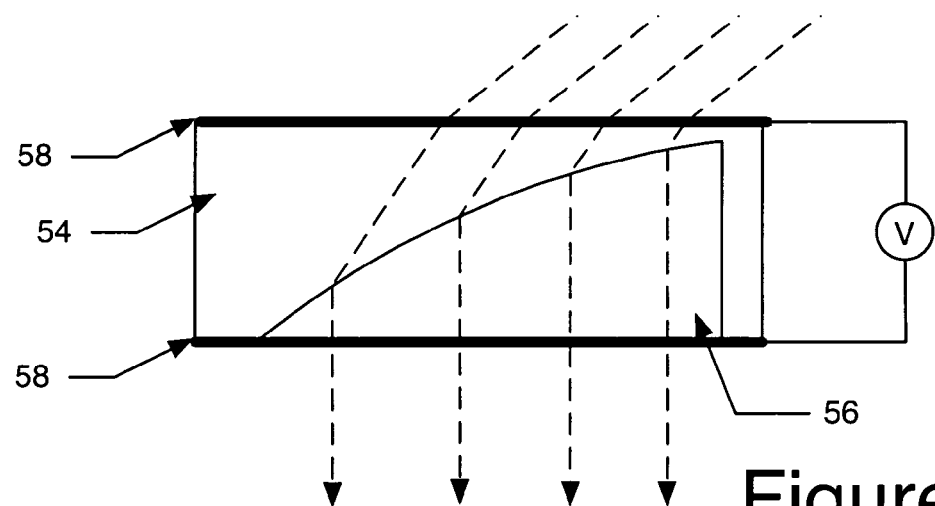
FIG. 13b is a cross-sectional view showing positive lensing corrected by concave groove curvature.
Figure 14A:
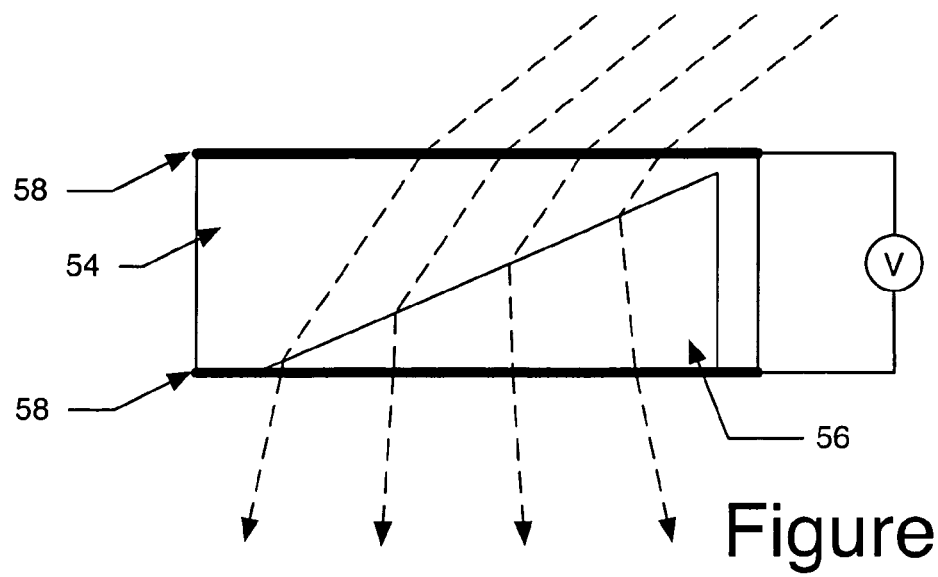
FIG. 14a is a cross-sectional view of negative lensing in a liquid crystal prism due to nonuniform field.
Figure 14B:
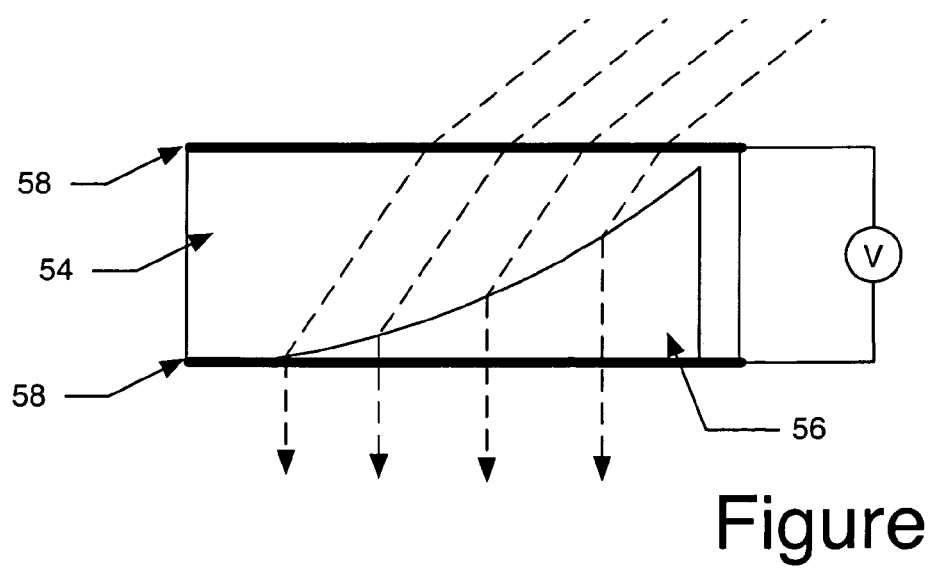
FIG. 14b is a cross-sectional view showing negative lensing corrected by convex groove curvature.

To some degree the lensing effect may be counteracted by using curved refracting surfaces. If the lensing acts like a positive lens, as in FIG. 13a, then a concave groove would recollimate the light as shown in FIG. 13b. If the lensing acts like a negative lens as in FIG. 14a, then a convex groove would recollimate the light as shown in FIG. 14b. If this feature is to be implemented then the liquid crystal and the transparent block material should be chosen to make $n_o$ and $n_{block}$ as close as possible to minimize lensing of the ordinary ray. While it is doubtful that one could perfectly compensate for index nonuniformity in this way, it could improve performance significantly and it doesn't cost any more to produce than a triangular grating once a die or mold has been fabricated.

1-Dimensional Solar Collector—Basic construction

Figure 15A:
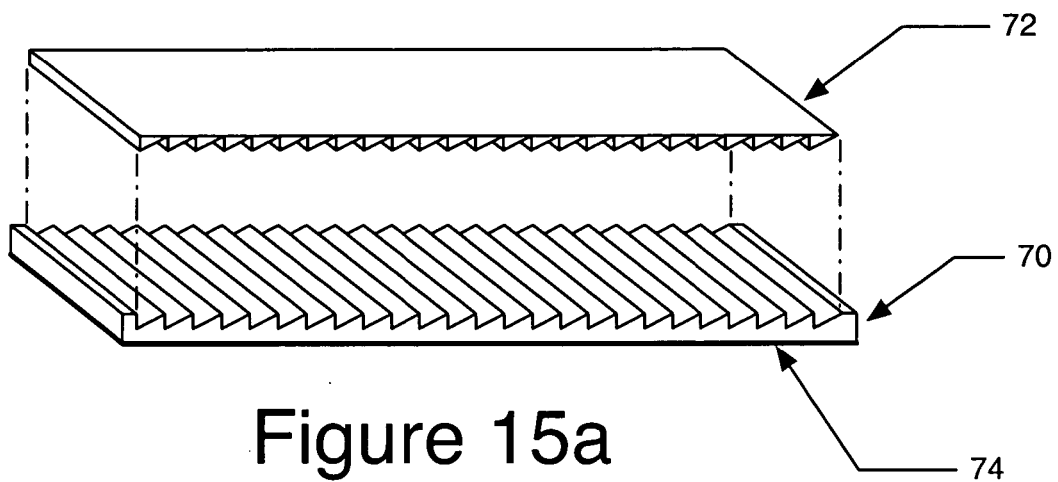
FIG. 15a is an exploded isometric view of a steering grating and the material which is used to fill the grooves.
Figure 15B:
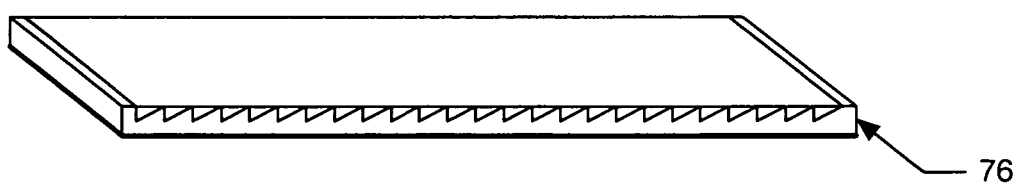
FIG. 15b is an isometric view of an assembled steering panel.

For the 1-dimensional case a particular application concentrates solar energy to a line focus for solar water heating. The discussion above indicates that such a device may be built, in part, from a series of parallel prism-shaped volumes of a material whose refractive index may be controled by an applied electric field. One way to construct such a device is to start with a steering grating 70 stamped, cast or machined into a sheet of transparent material such as polycarbonate or acrylic as shown in FIG. 15a. The simplest grating resembles a sawtooth in cross section. The tooth spacing and the angle a may be fixed or these parameters may be varied in a specific application. Filling the grooves of the steering grating with a material whose refractive index can be varied in a controlable manner results in an array of individual volumes 72, wherein each volume is shaped like the triangular prism analyzed above. Ideally, the material is isotropic. The steering grating 70 together with the material which fills the grooves 72 are referred to as a steering panel 76 as shown in FIG. 15b.

There are two issues to be addressed if the device is to use a liquid crystal material to fill the grooves. First, liquid crystal is birefringent and only the extraordinary refractive index may be varied by applying a field, so the single steering panel of FIG. 15b will only actively steer one polarization component of incident light. This may be be sufficient for a particular application. Should the application demand steering both polarizations the solution is to use a pair of prism arrays, one on top of the other, in which the director of the first array is perpendicular to the director of the second array.

The second issue is the fact that the extraordinary refractive index of liquid crystals varies under the influence of an applied electric field. This field is created by introducing a thin layer of conducting material on either side of each layer of liquid crystal and applying a voltage between the conducting planes. There are two basic criteria for the thin conducting layer: it must be transparent (or nearly so) and it must be a conductor. It need not, however, be a good conductor. The motion of the sun demands a very modest response time from the liquid crystal, which means the conductive layer need only be conductive enough to produce an equipotential surface under nearly steady conditions. A static dissipative (SD) layer, with a surface resistivity in the range $10^6$–$10^8$ Ohms/square, conducts well enough to remove accumulated charge in less than 50 milliseconds. A layer designated as conductive ($10^3$–$10^6$ Ohms/square) is a better conductor but is typically less transparent than a static dissipative layer.

Figure 16A:
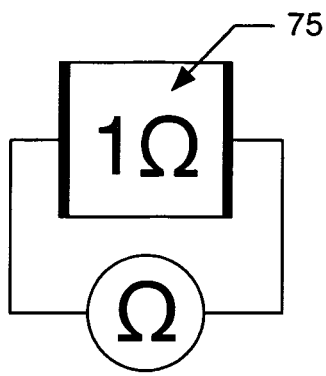
FIG. 16a is a diagram illustrating the measurement of surface conductivity of a square piece of a material.
Figure 16B:
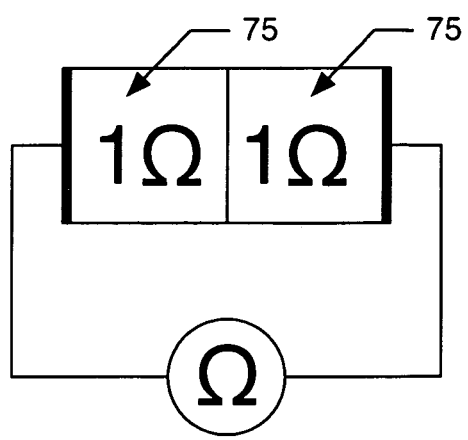
FIG. 16b is a diagram illustrating the measurement of surface conductivity of two square pieces of a material placed in series.
Figure 16C:
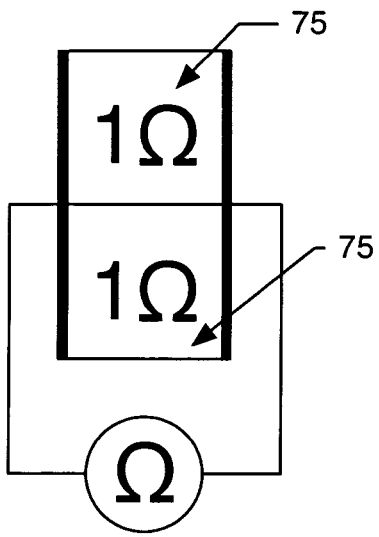
FIG. 16c is a diagram illustrating the measurement of surface conductivity of two square pieces of a material placed in parallel.
Figure 16D:
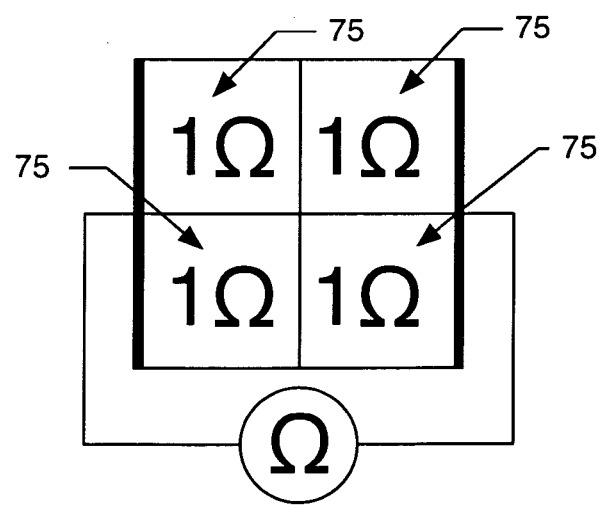
FIG. 16d is a diagram illustrating the measurement of surface conductivity of four square pieces of a material arranged in the form of a larger square.

Ohms per square is the unit of surface resistivity. It is a material parameter like density which is independent of size. Consider the measurement of surface resistance of square piece 75 of a given material as shown in FIG. 16a. Suppose for the sake of argument that the surface resistance is 1 Ohm. A pair of identical squares in series, shown in FIG. 16b, will have a total surface resistance of 2 Ohms. A pair of identical squares in parallel, shown in FIG. 16c, will have a total surface resistance of ½ Ohm. Finally, four identical squares arranged into a square as shown in FIG. 16d will have a surface resistance of 1 Ohm, identical to that of the single square. Therefore, measurement of the surface resistance of a material is independent of the area as long as the material is in the shape of a square.

Sheets of various thicknesses of clear acrylic, polycarbonate or polyvinyl chloride (PVC) with one or both faces coated with an SD layer are available commercially from a number of manufacturers, such as Boedeker Plastics of Shiner, Tex., Terra Universal of Anaheim, Calif. and Sci-Cron Technologies of Amarillo, Tex. Alternatively, a roll of film with an SD coating may be purchased from the same suppliers. In the simplest implementation, the steering grating is constructed from sheet material which has a static dissipative layer 74 on one surface as in FIG. 15a.

Figure 17A:
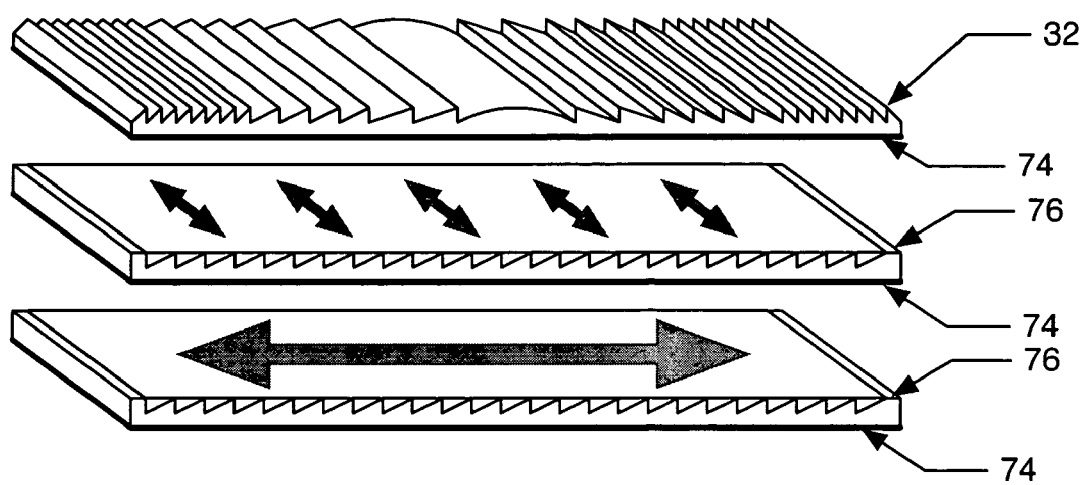
FIG. 17a is an isometric view of the components used to construct a first implementation of the 1D tracking solar concentrator.

With these conditions in mind, several possible solutions present themselves. The preferred implementation is constructed from two steering panels 76 and a 1-dimensional Fresnel lens 32, as shown in FIG. 17a, all of which have a transparent conducting layer 74 of at least static dissipative quality on the smooth surface. The focal length of the Fresnel lens depends on the application and the focus may lie on a line perpendicular to the surface of the Fresnel lens and passing through the center of the lens, or it may be offset. Many Fresnel lenses are available commercially from companies such as Fresnel Technologies.

Figure 17B:
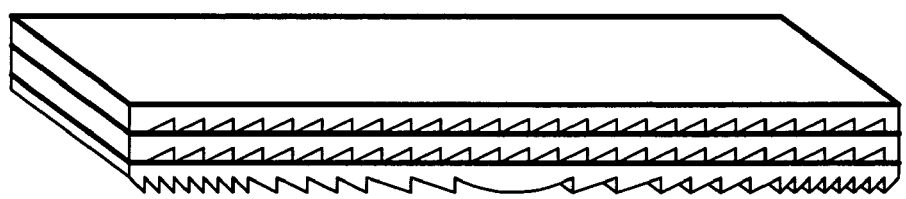
FIG. 17b is an isometric view of a first implementation of the 1D tracking solar concentrator.

Assembly begins with a first steering grating placed smooth surface down. The grooves of the steering grating are filled with liquid crystal material and the surface is brushed to fix the director either parallel to the long axis of the prism cells (longitudinal director) or perpendicular to the long axis (transverse director). A second steering grating is placed, smooth surface down, directly atop the first steering grating with the grooves of the second grating parallel to the grooves of the first grating. The grooves of the second steering grating are filled with liquid crystal and the surface is brushed to fix the director perpendicular to the director of the first layer of liquid crystal. Finally, the Fresnel lens is placed, smooth surface down, directly on top of the second steering grating. If a 1-dimensional Fresnel lens is used the the grooves of the Fresnel lens must be parallel to the grooves in the steering gratings. The entire assembly is then flipped over as shown in FIG. 17b. Light enters from above and is concentrated to a line below the assembly. The layers may be cemented together or pressed together while the edges are sealed.

Figure 18A:
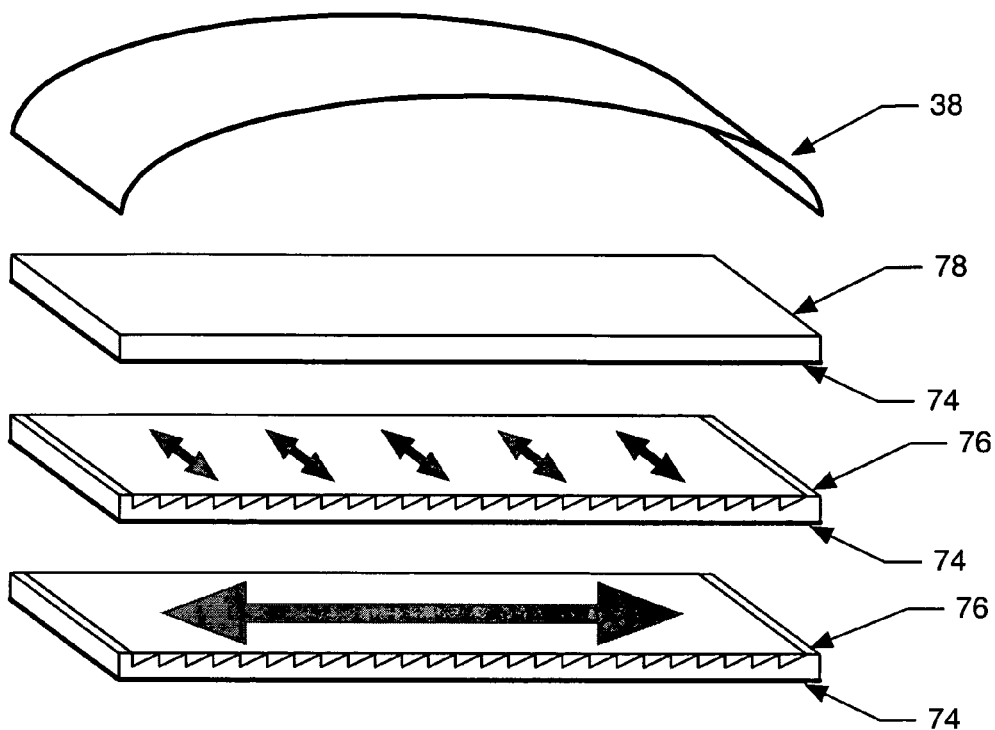
FIG. 18a is an isometric view of the components used to construct a second implementation of the 1D tracking solar concentrator.
Figure 18B:
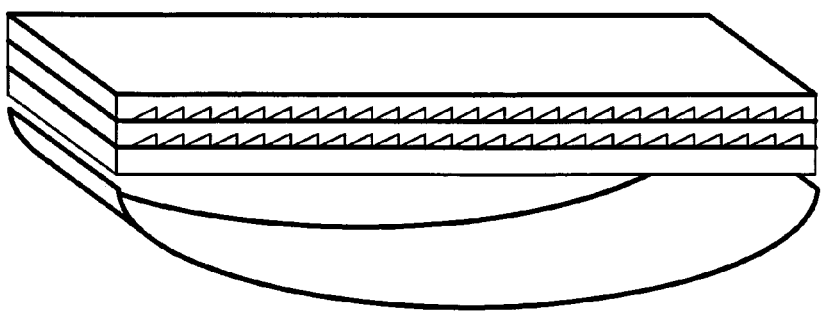
FIG. 18b is an isometric view of a second implementation of the 1D tracking solar concentrator.

A second preferred implementation uses a parabolic trough mirror 38 instead of a Fresnel lens, as shown in FIG. 18b. The conducting surface formerly provided by the Fresnel lens can be provided by an unmachined piece 78 of the material used to make the steering gratings, referred to as a cover plate, which has a static dissipative layer 74 on one face as shown in FIG. 18a. The transparent conducting surface of the cover plate is in contact with the liquid crystal prisms.

Figure 19A:
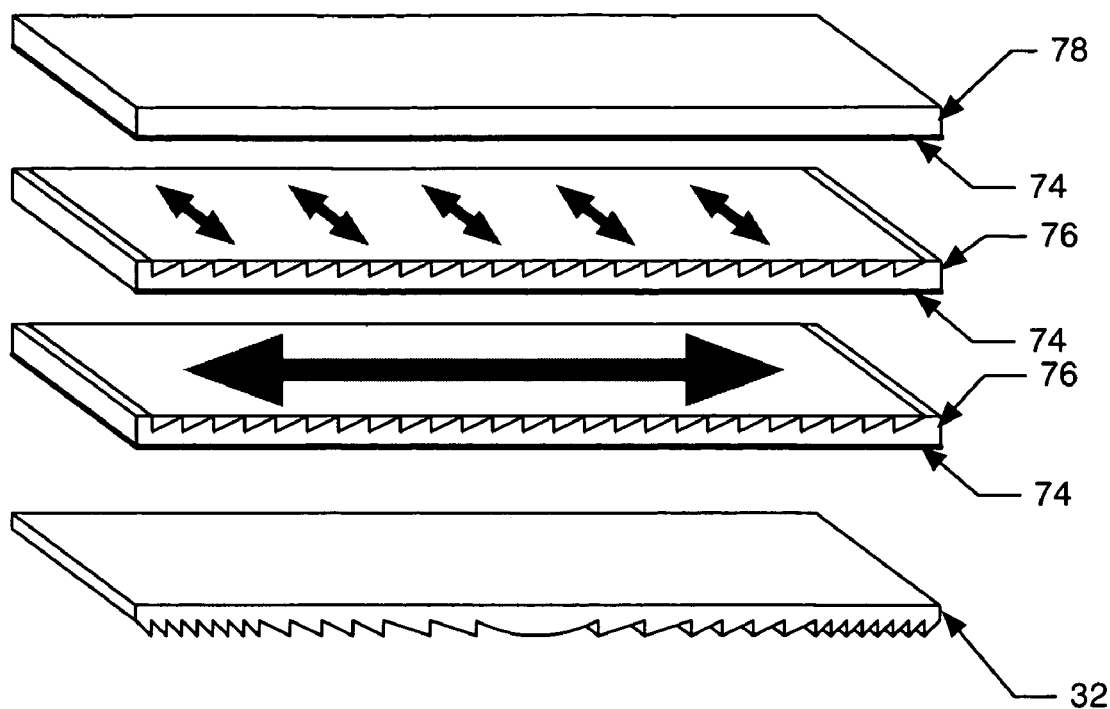
FIG. 19a is an isometric view of the components used to construct a third implementation of the 1D tracking solar concentrator.
Figure 19B:
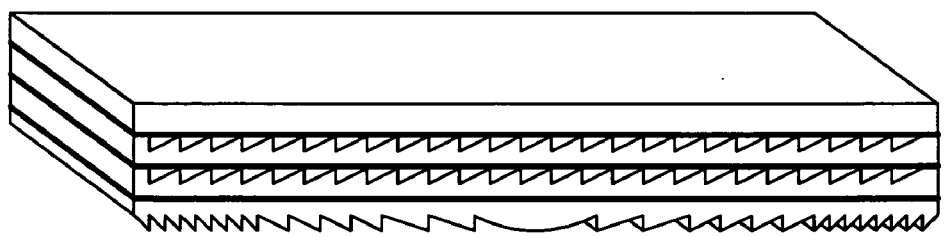
FIG. 19b is an isometric view of a third implementation of the 1D tracking solar concentrator.
Figure 20A:
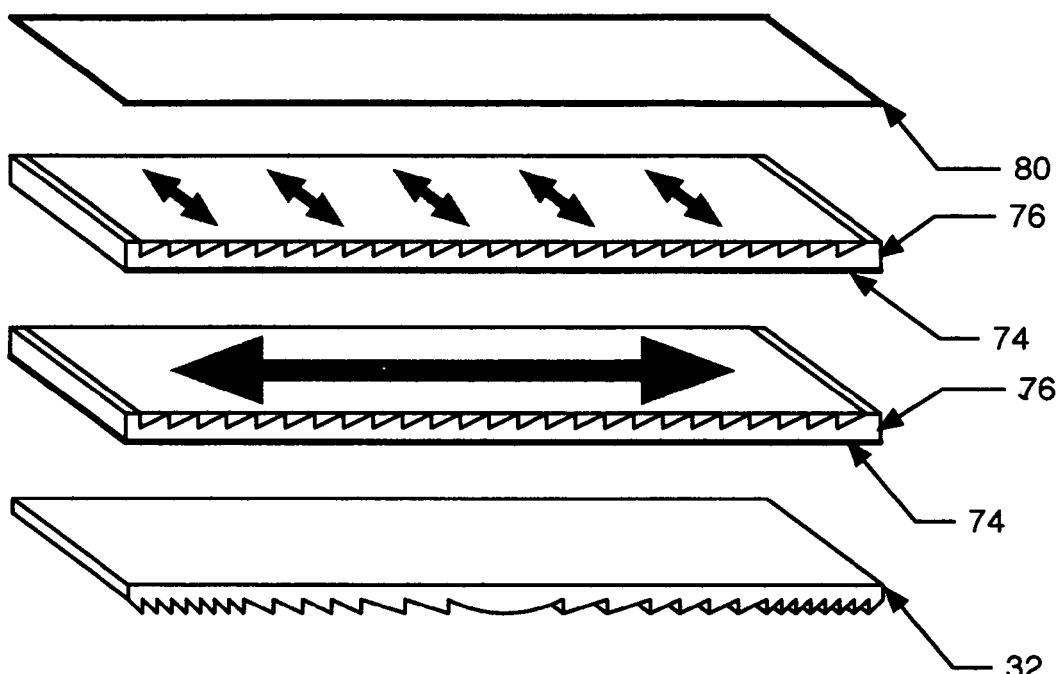
FIG. 20a is an isometric view of the components used to construct a fourth implementation of the 1D tracking solar concentrator.
Figure 20B:
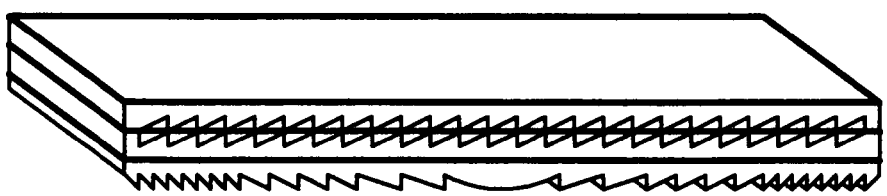
FIG. 20b is an isometric view of a fourth implementation of the 1D tracking solar concentrator.

There are many variations on this theme, combinations of steering gratings and cover plates used with either a parabolic trough, a 1-dimensional Fresnel lens, a 2-dimensional Fresnel lens, or some other optical condenser as shown in FIGS. 19 and 20. The two steering panels 76 in FIG. 20 are separated by a thin film 80 that has a conductive coating. Either the lower steering panel has the conductive coating (as shown in FIG. 20a) or the smooth side of the Fresnel lens has the conductive coating, but not both.

Figure 22A:
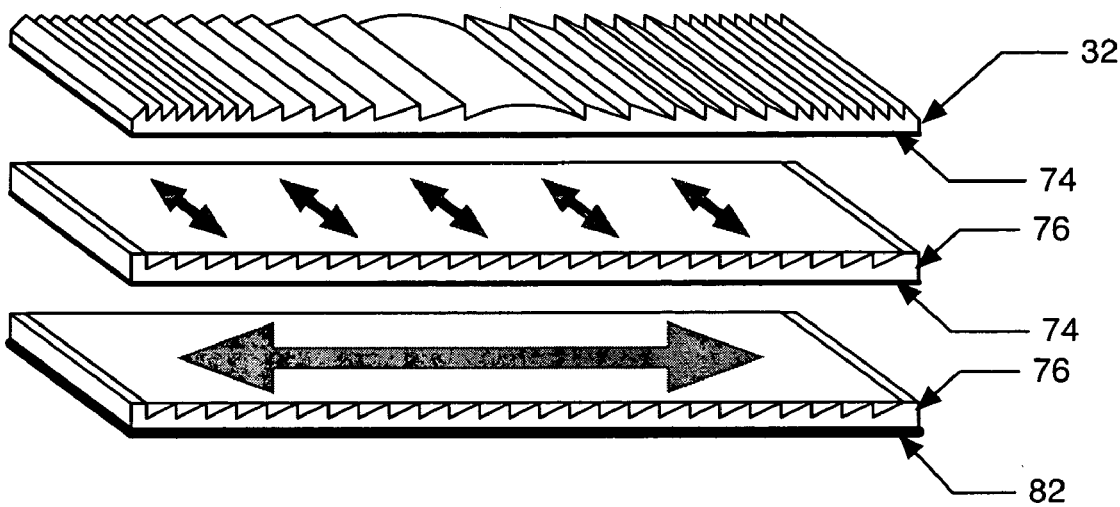
FIG. 22a is an isometric view of the components used to construct a sixth implementation of the 1D tracking solar concentrator.
Figure 22B:
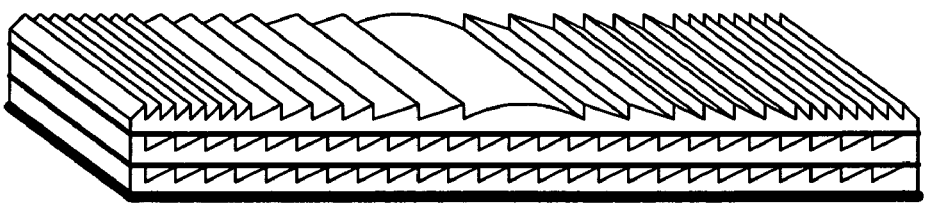
FIG. 22b is an isometric view of a sixth implementation of the 1D tracking solar concentrator.
Figure 23:
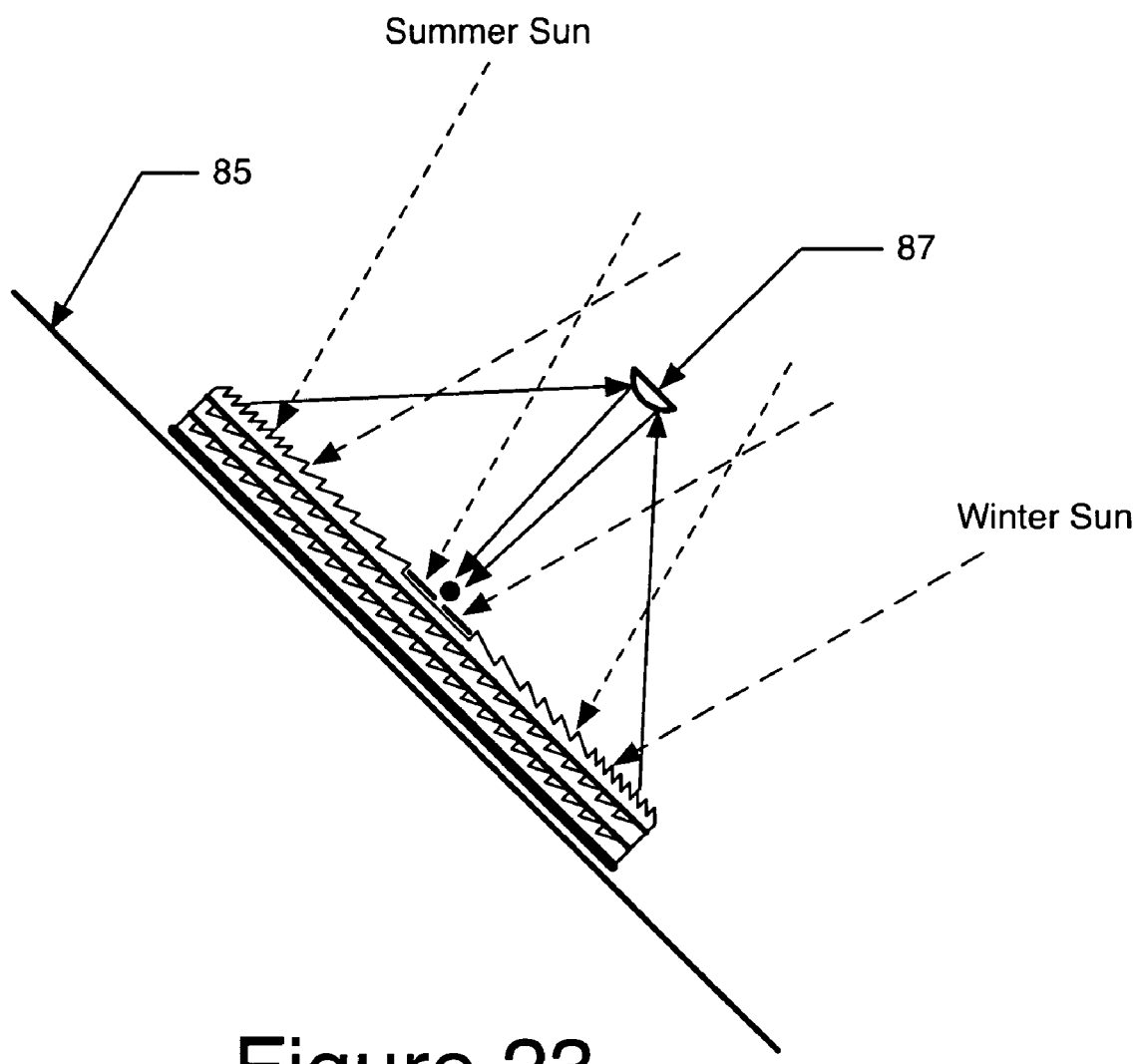
FIG. 23 is a cross-sectional view of a seventh implementation of the 1D tracking solar concentrator.

The variations shown in FIG. 21 and FIG. 22 operate in a somewhat different way than the previous implementations. In both cases, light passes through the steering panel assembly, strikes a mirror and then passes through the steering panel assembly a second time as it travels to the focus. In FIG. 21 the mirror is a parabolic trough 38 and doubles as the condenser. The curved steering panels 84 are applied to the inner surface of the mirror. In FIG. 22 a refracting condenser such as a Fresnel lens 32 is used and the mirror 82 is flat. All that is necessary to produce the flat mirror is to replace the transparent conductive layer of the bottom most steering grating with a reflective conductive coating such as a thin layer of aluminum. This device is particularly interesting: since the focus is located above the Fresnel lens it can be made very thin and laid flat on any smooth, opaque surface such as the pitched roof 85 of a house as shown in FIG. 23. Since the device no longer needs to support its own weight the steering panels may be made very thin, which saves on material cost. Furthermore, the addition of a lightweight 1D convex reflector 87 suspended above the device allows the target, normally a pipe filled with circulating fluid, to rest on the surface of the Fresnel lens.

In all cases, the throughput and deflection range are determined by the steering gratings, and the concentration ratio is determined by the condenser. In all cases the placement of the three conducting layers is such that one may separately control the extraordinary refractive index of each array of liquid-crystal-filled prisms should this be necessary. A voltage between the top conducting layer and the middle conducting layer produces an electric field in the upper array of liquid crystal prisms, and a voltage between the middle conducting layer and the bottom conducting layer produces an electric field in the lower array of liquid crystal prisms.

Analyze the steering panel of FIG. 17 as a representative case. The construction and analysis for all the other implementations proceeds in much the same way. The steering gratings can be made from 3 mm thick polycarbonate which has one static dissipative surface (available from Boedeker Plastics, Inc.). Use a blaze angle of $\alpha=45°$ degrees, and a groove density of 2 grooves/mm. A variety of standard liquid crystals are available, of which BDH-E44 is a typical member, having ordinary refractive index $n_o=1.53$ and zero-field extraordinary refractive index $n_e=1.79$. This and other liquid crystals are commercially available from E. M. Industries of Hawthorne, N.Y. The steering assembly is fastened onto a Fresnel lens, or across the face of a parabolic trough for which the focus lies just inside the face. Solar energy is concentrated to a line focus onto a water line as shown in FIG. 1 and FIG. 2. Analysis using Snell's Law indicates that the incident angles for which this particular beam deflector can provide normal incidence on the condenser ranges from $-5.57°$ to $9.74°$ for one polarization and from $-5.57°$ to $9.70°$ for the other polarization. When a is increased to $60°$ then the incident angles for which this particular beam deflector can provide normal incidence on the condenser ranges from $-9.2°$ to $20.0°$ for one polarization and from $-9.2°$ to $19.5°$ for the other polarization, for a total deflection range of about $29°$.

Since there is a difference, however modest, between the steering of one polarization versus the other, a separate voltage control must be provided for each liquid crystal layer for maximum quality of focus. In practice the voltage differences are slight. If the somewhat reduced performance is acceptable the device may be simplified by having a single voltage source control both liquid crystal layers.

A deflection range of $29°$ is acceptable for a line focus solar water heater designed to accommodate for the Sun's seasonal variation in temperate latitudes. A simple calculation shows that a properly aligned device (for which one extreme of the deflection range corresponds to the summer solstice) accommodates the position of the Sun for 105 days on either side of the summer solstice (210 days total). That is, the device works 7 months of the year, from early March until early October. In milder climates, where solar water heating is an option for larger portions of the year, a device with a larger deflection range may be designed and constructed. For instance, using symmetric grooves as in FIG. 9 and $\alpha=60°$ leads to a deflection range of about $40°$, which would accommodate the position of the Sun for 136 days on either side of the summer solstice (from early February to early November).

Figure 24A:
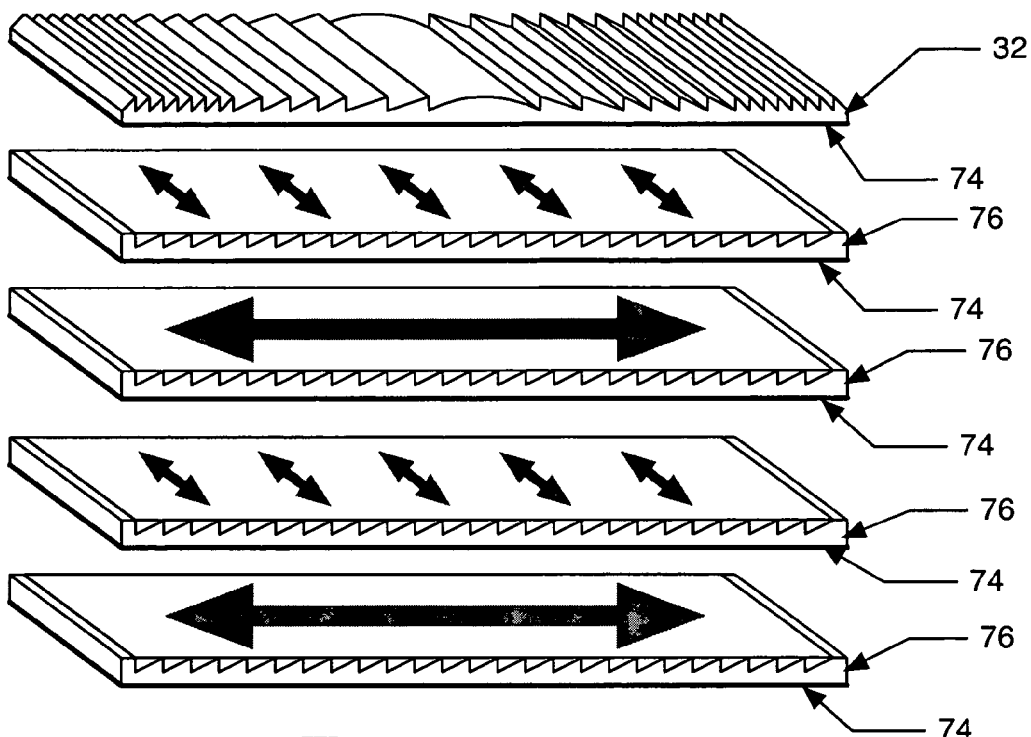
FIG. 24a is an isometric view of the components used to construct an eighth implementation of the 1D tracking solar concentrator.
Figure 24B:
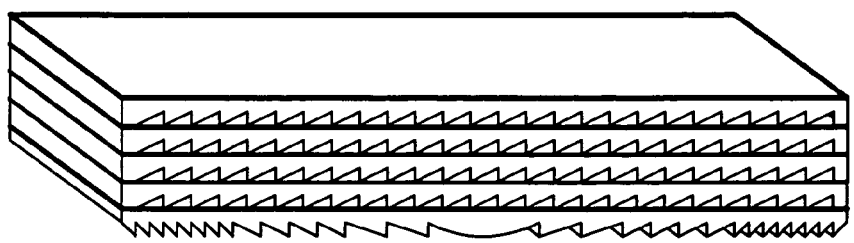
FIG. 24b is an isometric view of an eighth implementation of the 1D tracking solar concentrator.
Figure 25A:
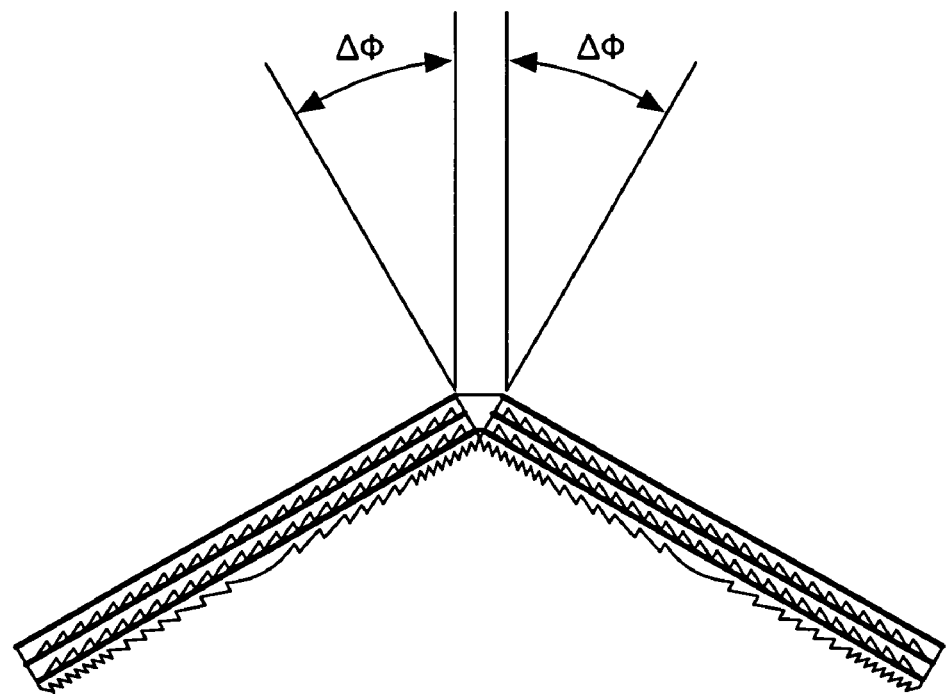
FIG. 25a is a cross-sectional view of a pair of 1D tracking solar concentrators used together in a segmented structure in order to extend the deflection range.
Figure 25B:
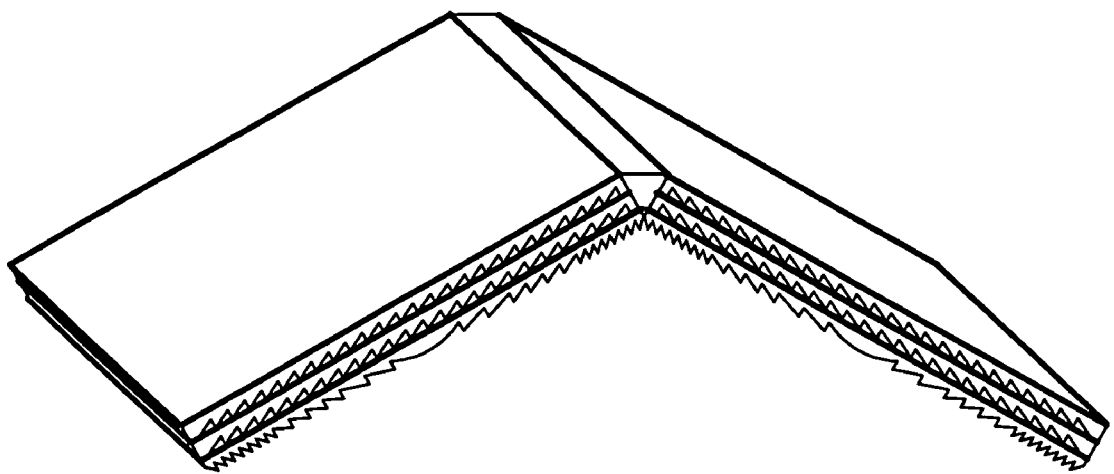
FIG. 25b is an isometric view of a pair of 1D tracking solar concentrators used together in a segmented structure in order to extend the deflection range.

The deflection range can be improved in several ways. First, a liquid crystal which has larger birefringence may be used. Second, a larger blaze angle may be used. Third, symmetric grooves may be used as shown in FIG. 9 and discussed above. Fourth, two or more of the beam deflectors as described above may be stacked one on top of the other (i.e. four or more steering panels) as shown in FIGS. 24a and 24b. Fifth, one can make a segmented structure consisting of two or more panels that are tilted with respect to each other as shown in FIGS. 25a and 25b. These variations may be used in any combination depending on the details of the application.

Alignment and Control

There are two basic strategies one may pursue for maintaining the optical alignment of the device. In either case, control of the refractive index of the liquid crystal prisms requires a variable voltage source and a power supply. The first strategy uses a clock and a look-up table. If the latitude and alignment (usually East-West) of the device are known then the position of the Sun can be calculated for any time of day or year. A table yields the voltage required to keep the focus at the desired location. This is simple conceptually, but in practice this approach is complicated by changing temperatures, shifting of the physical components of the device over time, and wind loading.

Figure 26:
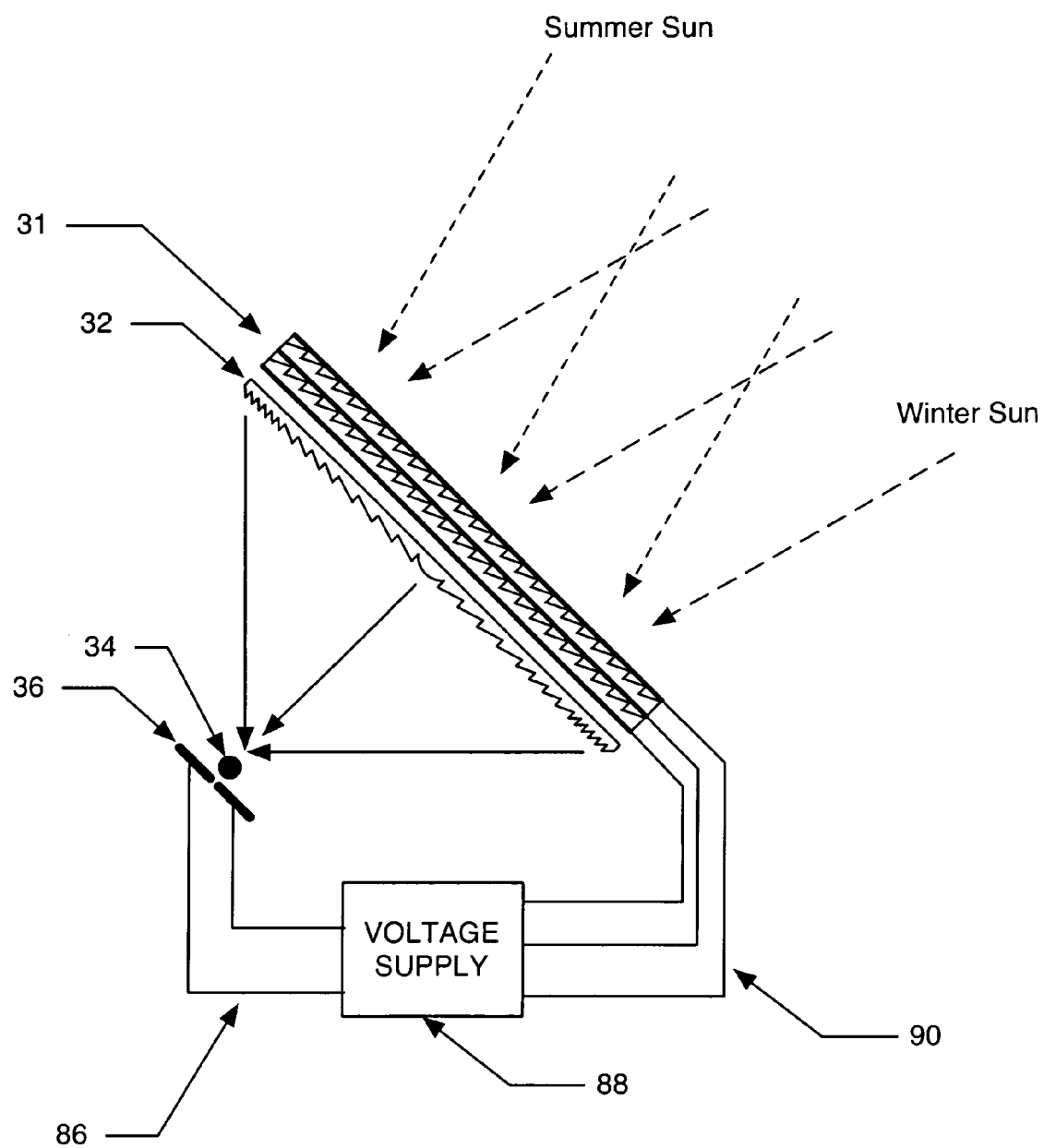
FIG. 26 is a cross-sectional view showing a 1D tracking solar concentrator and a means by which the device may be controlled.

FIG. 26 illustrates a more sophisticated strategy wherein detectors 36 are placed near the desired location of the focus. The output of the detectors is used to continuously monitor the quality of the alignment so the control voltage(s) may be adjusted as necessary. In the preferred implementation a pair of photovoltaic (PV) cells 36 is placed behind a target 34 such as a water pipe. The PV cells are placed side by side with their adjacent edges parallel to and directly behind the target. Each PV cell is wired 86 into a controlable voltage supply 88 which provides a voltage to each steering panel via electrical connections 90. Most of the concentrated light falls on the pipe while a small amount misses the pipe and strikes one or both PV cells. If the power absorbed by one cell is the same as that absorbed by the second cell then the bulk of the optical power falls on the pipe as desired. If one PV cell absorbs more power than the other the device is presumed to be misaligned. The output of the voltage supply is adjusted until the powers from the PV cells equalize. As an added feature, the PV cells can be used to power the device; the liquid crystal layers function electrically as capacitors with very low leakage current so they require very little power. The PV cells and the voltage supply can be manufactured as a unit, and the voltage is supplied to the conductive layers of the beam steering assembly with wires. Controlling the tracking solar concentrator in this way makes the device less susceptible to alignment degradation due to shifting of the components, and active feedback mitigates the problems caused by wind noise.

Other components may be added to improve the control of the device. For instance, a rechargeable battery may be used to power the device, so that alignment is preserved during periods of cloud cover and darkness. The pair of PV cells may then be used to power a recharging circuit for the battery as well as to provide alignment status to the voltage control.

Two Dimensional Device

Figure 27A:
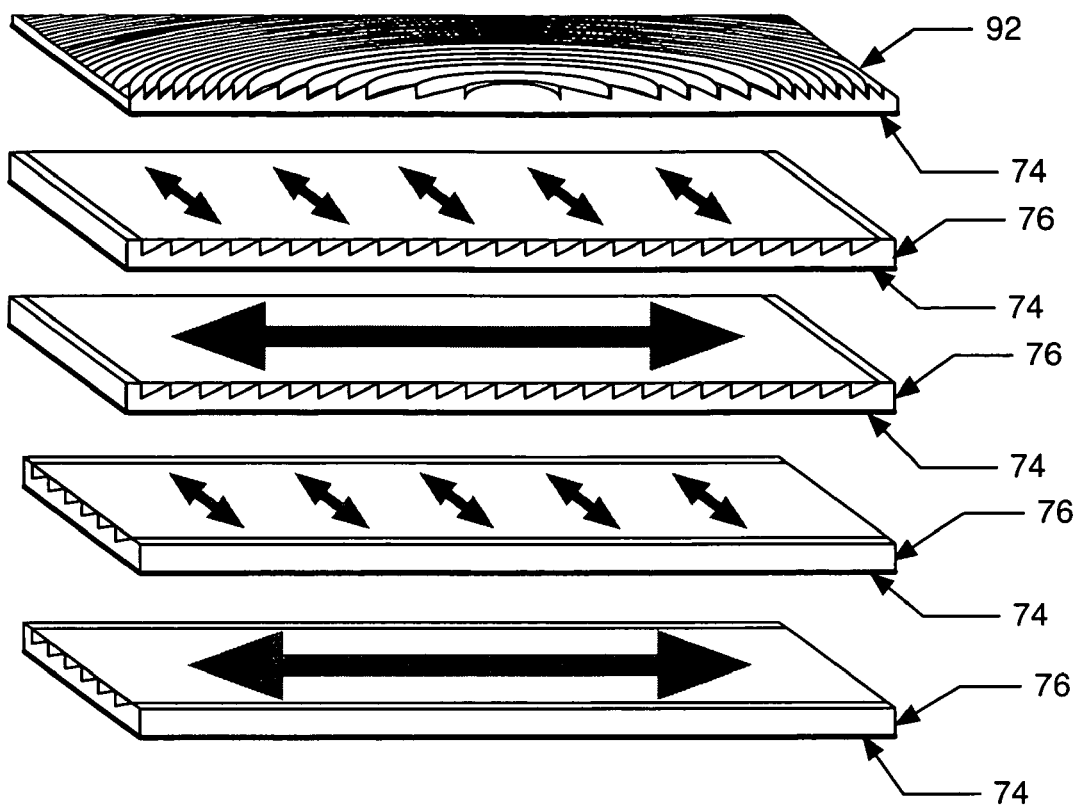
FIG. 27a is an isometric view of the components used to construct a first implementation of the 2D tracking solar concentrator.
Figure 27B:
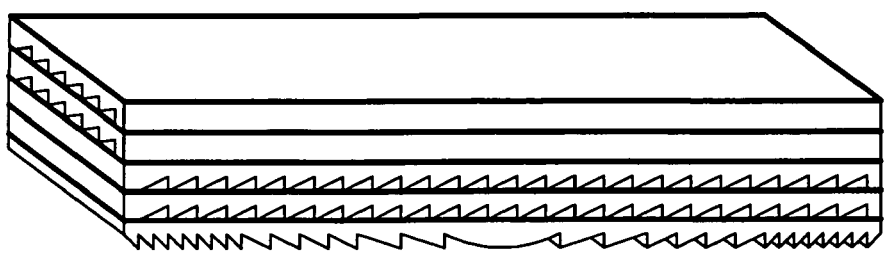
FIG. 27b is an isometric view of a first implementation of the 2D tracking solar concentrator.

Certain applications, such as daylighting via fiberoptic cable, require high concentration of light, i.e. point focus as opposed to line focus. This in turn requires two-dimensional tracking of the sun's apparent motion. The preferred 2D implementation uses a point-focus condenser, such as the Fresnel lens 92 shown in FIG. 27a, and at least two pairs of steering panels. Each pair has a steering panel with a transverse director and a steering panel with a longitudinal director. The grooves of the first pair of steering panels are perpendicular to the grooves of the second pair of steering panels. Construction proceeds in the same way as the one-dimensional device.

The 1D variations illustrated in FIGS. 17 through 24 can all be generalized to the 2D case. Of particular interest is the 2D version of FIG. 22, shown in FIG. 28. Once again, the bottom most steering grating has a reflective conductive coating 82 instead of a transparent conductive coating, and the Fresnel lens 92 and all the steering gratings 76 can be made from very thin material. Since the focus lies above the Fresnel lens the device may then lie flat on a smooth opaque surface and requires no other mechanical support. FIG. 29 shows this device mounted to a pitched roof 85. The addition of a lightweight convex reflector 89 suspended above the device allows the target, such as the end of an optical fiber 91, to reside on the surface of the Fresnel lens.

Figure 28A:
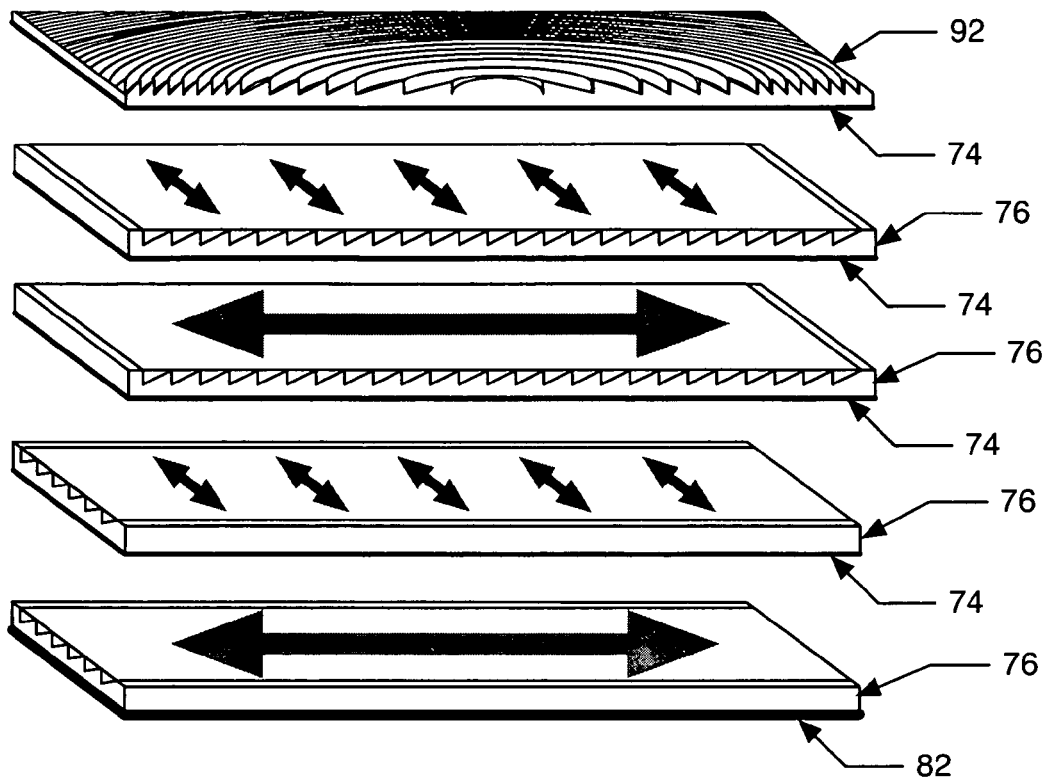
FIG. 28a is an isometric view of the components used to construct a second implementation of the 2D tracking solar concentrator.
Figure 28B:
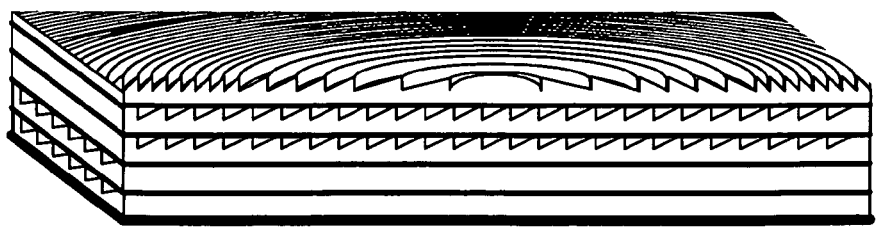
FIG. 28b is an isometric view of a second implementation of the 2D tracking solar concentrator.
Figure 29:
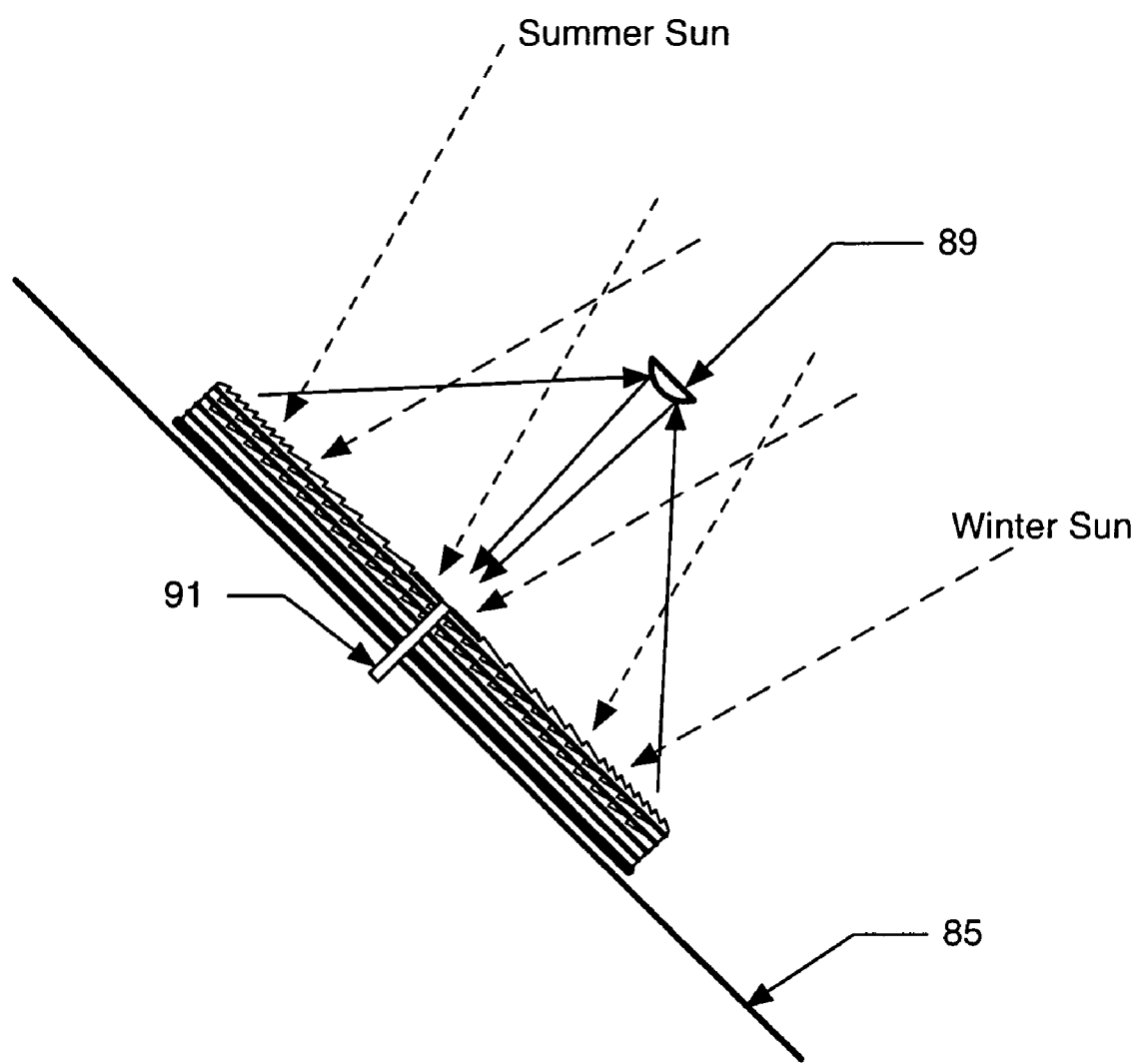
FIG. 29 is a cross-sectional view of a third implementation of the 2D tracking solar concentrator.
Figure 30:
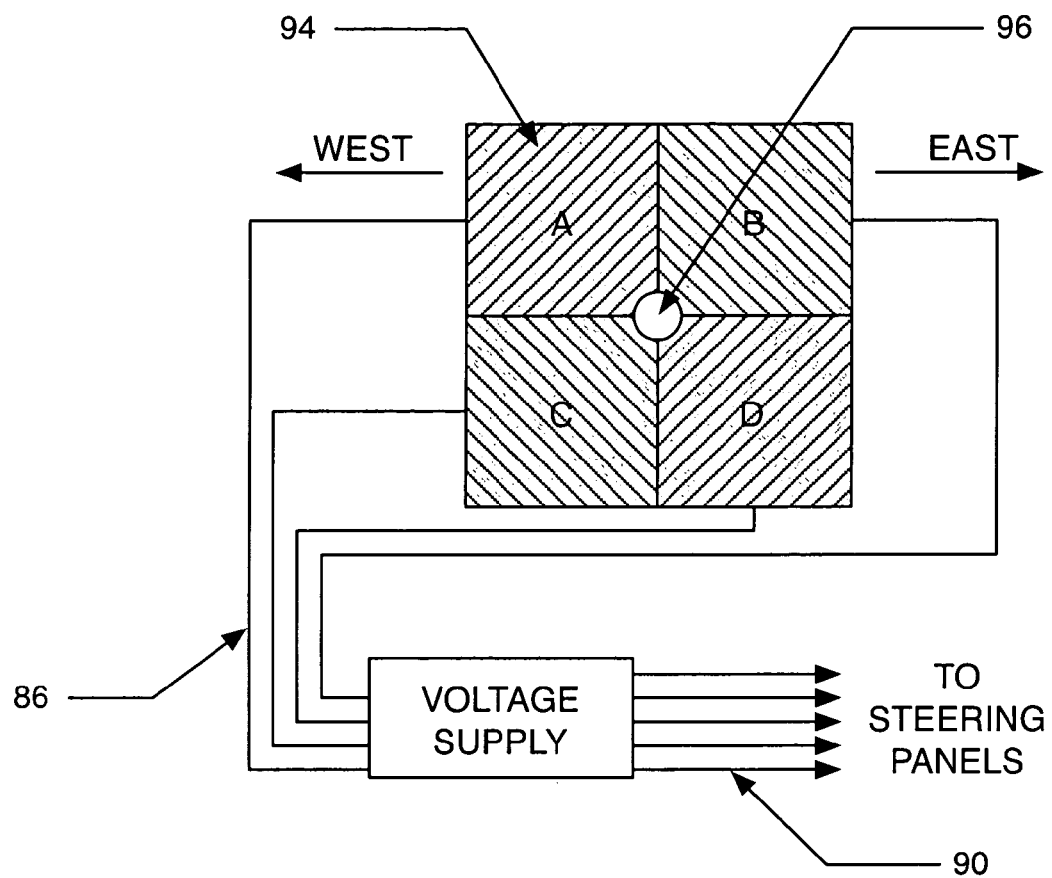
FIG. 30 shows a means by which the 2D tracking solar concentrator may be controlled.

Alignment of the 2D optical concentrator can be controlled with a square array of photovoltaic cells 94 surrounding the end of the fiber 96 as shown in FIG. 28. Comparison of the total power in cell A and cell B to the total power in cell C and cell D are used to maintain alignment of the Sun in the north-south direction. Comparison of the total power in cell A and cell C to the total power in cell B and cell D are used to maintain alignment of the Sun in the east-west direction.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. An optical concentrator for concentrating light from a moving light source comprising:
   a) a substantially transparent sheet made from a material having a substantially constant refractive index;
   b) wherein said substantially transparent sheet has a series of grooves formed in a face, said series of grooves defining a groove array;
   c) wherein said groove array is filled with a layer of substantially transparent material having an electrically changeable refractive index when an electromagnetic field is applied thereto, said layer of substantially transparent material being defined as an active layer;
   d) a means for applying an electromagnetic field having a changeable strength to said active layer;
   e) a means for controlling the strength of said electromagnetic field;
   f) an optical condenser, positioned in optical communication with said substantially transparent sheet and said active layer;
   g) wherein light from a light source interacts with said substantially transparent sheet and said active layer and said optical condenser such that said light is concentrated in a localized region of space.

2. The optical concentrator of claim 1 further comprising:
   a) a plurality of substantially transparent sheets having a plurality of groove arrays;
   b) a plurality of active layers;
   c) wherein said substantially transparent sheets and said active layers are positioned in optical communication with said optical condenser.

3. The optical concentrator of claim 2 wherein an active layer lies between two conducting layers that are electrically connected to a voltage source for providing an electromagnetic field through said active layer when said voltage source produces a voltage.

4. The optical concentrator of claim 3 wherein said plurality of groove arrays have grooves that are parallel with respect to one another.

5. The optical concentrator of claim 4 wherein an active layer is comprised of a liquid crystal material having a director.

6. The optical concentrator of claim 5 wherein said plurality of active layers has a first group of directors having directors that are parallel with respect to one another, and a second group of directors having directors that are perpendicular with respect to the directors of said first group of directors.

7. The optical concentrator of claim 3 wherein said plurality of groove arrays has a first group of groove arrays having grooves that are parallel with respect to one another, and a second group of groove arrays having grooves that are perpendicular with respect to the grooves in said first group of groove arrays.

8. The optical concentrator of claim 7 wherein an active layer is comprised of a liquid crystal material having a director.

9. The optical concentrator of claim 8 wherein said plurality of active layers has a first group of directors having directors that are parallel with respect to one another, and a second group of directors having directors that are perpendicular with respect to the directors of said first group of directors.

10. The optical concentrator of claim 1 further comprising a reflecting surface positioned in optical communication with said substantially transparent sheet and said active layer and said optical condenser, wherein light from a light source interacts with said substantially transparent sheet and said active layer and said optical condenser and said reflecting surface such that said light is concentrated in a localized region of space.

11. The optical concentrator of claim 10 further comprising:
   a) a plurality of substantially transparent sheets having a plurality of groove arrays;
   b) a plurality of active layers;
   c) wherein said substantially transparent sheets and said active layers are positioned in optical communication with said optical condenser and said reflecting surface.

12. The optical concentrator of claim 11 wherein an active layer lies between two conducting layers that are electrically connected to a voltage source for providing an electromagnetic field through said active layer when said voltage source produces a voltage.

13. The optical concentrator of claim 12 wherein said plurality of groove arrays have grooves that are parallel with respect to one another.

14. The optical concentrator of claim 13 wherein an active layer is comprised of a liquid crystal material having a director.

15. The optical concentrator of claim 14 wherein said plurality of active layers has a first group of directors having directors that are parallel with respect to one another, and a second group of directors having directors that are perpendicular with respect to the directors of said first group of directors.

16. The optical concentrator of claim 12 wherein said plurality of groove arrays has a first group of groove arrays having grooves that are parallel with respect to one another, and a second group of groove arrays having grooves that are perpendicular with respect to the grooves in said first group of groove arrays.

17. The optical concentrator of claim 16 wherein an active layer is comprised of a liquid crystal material having a director.

18. The optical concentrator of claim 17 wherein said plurality of active layers has a first group of directors having directors that are parallel with respect to one another, and a second group of directors having directors that are perpendicular with respect to the directors of said first group of directors.

* * * * *